(12) United States Patent
Kitanishi et al.

(10) Patent No.: US 11,973,486 B2
(45) Date of Patent: Apr. 30, 2024

(54) ELECTRONIC COMPONENT AND METHOD FOR MANUFACTURING THE SAME

(71) Applicant: KYOCERA Corporation, Kyoto (JP)

(72) Inventors: Sinichiro Kitanishi, Higashiomi (JP); Akira Oikawa, Higashiomi (JP)

(73) Assignee: Kyocera Corporation, Kyoto (JP)

( * ) Notice: Subject to any disclaimer, the term of this patent is extended or adjusted under 35 U.S.C. 154(b) by 404 days.

(21) Appl. No.: 17/442,702

(22) PCT Filed: Mar. 9, 2020

(86) PCT No.: PCT/JP2020/009966
§ 371 (c)(1),
(2) Date: Sep. 24, 2021

(87) PCT Pub. No.: WO2020/195741
PCT Pub. Date: Oct. 1, 2020

(65) Prior Publication Data
US 2022/0123713 A1    Apr. 21, 2022

(30) Foreign Application Priority Data
Mar. 25, 2019   (JP) ................. 2019-056677

(51) Int. Cl.
*H05K 1/18*       (2006.01)
*H01L 23/08*      (2006.01)
(Continued)

(52) U.S. Cl.
CPC ............. *H03H 9/059* (2013.01); *H01L 23/08* (2013.01); *H03H 3/08* (2013.01); *H03H 9/1064* (2013.01);
(Continued)

(58) Field of Classification Search
CPC ........ H03H 9/059; H03H 3/08; H03H 9/1064; H03H 9/25; H01L 23/08; H05K 1/185;
(Continued)

(56) References Cited

U.S. PATENT DOCUMENTS

2001/0033120 A1   10/2001   Kobayashi et al.
2007/0200146 A1*   8/2007   Onishi ................. H03H 9/0576
                                                                    257/202
(Continued)

FOREIGN PATENT DOCUMENTS

JP      08-023259 A     1/1996
JP    2001-094390 A     4/2001
(Continued)

*Primary Examiner* — Binh B Tran
(74) *Attorney, Agent, or Firm* — Volpe Koenig

(57) ABSTRACT

An electronic component includes an insulating surrounding member surrounding the electronic element while allowing a first surface of the electronic element to be exposed from a second surface of the surrounding member. A wiring board faces a third surface comprising the first and second surfaces. An insulating joining member is interposed between the third surface and the wiring board and joins the third surface and the wiring board together. A conductive bump, located between the third surface and the wiring board, electrically connects the electronic element and the wiring board. The joining member has a first through hole that overlaps a vibration region in the first surface in perspective plan view. The joining member has a second through hole that accommodates the bump. At least a portion of at least one of the first through hole or the second through hole overlaps the second surface in perspective plan view.

10 Claims, 9 Drawing Sheets

(51) Int. Cl.
*H03H 3/08* (2006.01)
*H03H 9/05* (2006.01)
*H03H 9/10* (2006.01)
*H03H 9/25* (2006.01)
*H05K 3/28* (2006.01)
*H05K 3/34* (2006.01)

(52) U.S. Cl.
CPC ............... *H03H 9/25* (2013.01); *H05K 1/185* (2013.01); *H05K 3/284* (2013.01); *H05K 3/341* (2013.01); *H05K 2201/10068* (2013.01)

(58) Field of Classification Search
CPC .................. H05K 3/284; H05K 3/341; H05K 2201/10068
USPC ......................................................... 361/761
See application file for complete search history.

(56) References Cited

U.S. PATENT DOCUMENTS

| | | | |
|---|---|---|---|
| 2014/0003017 A1 | 1/2014 | Kai et al. | |
| 2014/0369013 A1 | 12/2014 | Oikawa | |
| 2019/0381795 A1* | 12/2019 | Tonomura | ............... B41J 2/0457 |

FOREIGN PATENT DOCUMENTS

| | | |
|---|---|---|
| JP | 2006-120981 A | 5/2006 |
| WO | 2012/132147 A1 | 10/2012 |
| WO | 2013/039149 A1 | 3/2013 |

\* cited by examiner

ELECTRONIC COMPONENT AND METHOD FOR MANUFACTURING THE SAME

TECHNICAL FIELD

The present disclosure relates to an electronic component, such as an SAW (surface acoustic wave) device, and a method for manufacturing the same.

BACKGROUND ART

An electronic component that includes an electronic element and a wiring board on which the electronic element is mounted with its face down is known (for example, PTL 1 and PTL 2). The wiring board includes an external terminal that is located on a side opposite to a surface on which the electronic element is mounted, and input and output to and from the electronic element are performed via the external terminal. The electronic element and the wiring board are electrically connected to each other by, for example, a conductive bump that is interposed therebetween. The electronic component according to PTL 1 includes a sealing member that is interposed between the electronic element and the wiring board and that is made of a conductive bonding agent. The electronic component according to PTL 2 includes a resin that covers the top surface of the wiring board from above the electronic element to seal the electronic element.

CITATION LIST

Patent Literature

PTL 1: Japanese Unexamined Patent Application Publication No. 2001-94390
PTL 2: International Publication No. 2013/039149

SUMMARY OF INVENTION

An electronic component according to one aspect of the present disclosure includes an electronic element, an insulating surrounding member, a wiring board, an insulating joining member, and a conductive bump. The electronic element has a first surface. The surrounding member has a second surface and is in close contact with the electronic element so as to surround the electronic element while allowing the first surface to be exposed from the second surface. The wiring board faces a third surface constituted by the first surface and the second surface. The joining member is interposed between the third surface and the wiring board and joins the third surface and the wiring board together. The bump is located between the third surface and the wiring board and electrically connects the electronic element and the wiring board to each other. The first surface includes a vibration region that vibrates in response to an electric signal input to the electronic element. The joining member has a first through hole that passes through the joining member from the third surface to the wiring board and overlaps the vibration region in perspective plan view, and a second through hole that passes through the joining member from the third surface to the wiring board and accommodates the bump. At least a portion of at least one of the first through hole or the second through hole overlaps the second surface in perspective plan view.

An electronic component manufacturing method according to one aspect of the present disclosure includes: a disposition step of disposing an electronic element on a supporting body so as to bring a first surface of the electronic element into close contact with the supporting body; a forming step of supplying an insulating material around the electronic element on the supporting body and hardening the insulating material to form a surrounding member; a removal step of removing the supporting body from the first surface and from a second surface of the surrounding member from which the first surface is exposed; and a joining step of disposing an insulating material that makes up a joining member between a third surface constituted by the first surface and the second surface and a wiring board to join the third surface and the wiring board together, and disposing a conductive bump between the third surface and the wiring board to electrically connect the electronic element and the wiring board to each other. In the joining step, in the material that makes up the joining member, a first through hole that passes through the material making up the joining member from the third surface to the wiring board and overlaps the vibration region in perspective plan view, and a second through hole that passes through the material making up the joining member from the third surface to the wiring board and accommodates the bump are made. At least a portion of at least one of the first through hole or the second through hole overlaps the second surface in perspective plan view.

DESCRIPTION OF EMBODIMENTS

Figure 1A:
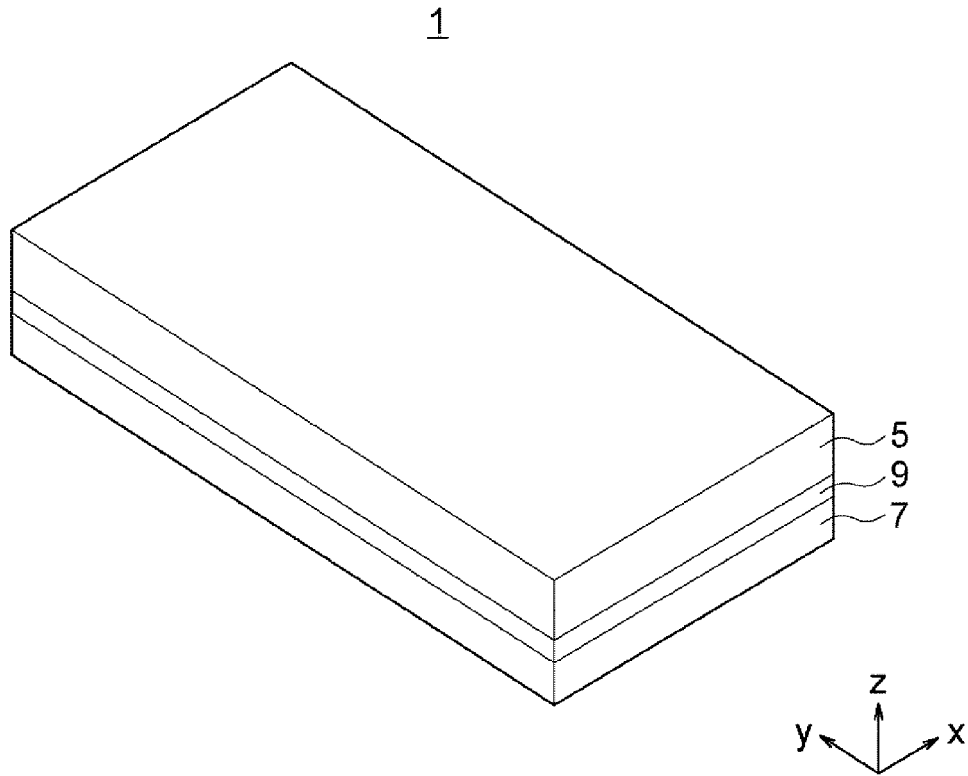
FIG. 1A and FIG. 1B are perspective views illustrating the external appearance of an electronic component according to a first embodiment when viewed from the top surface side and from the bottom surface side respectively.

Hereinafter, an electronic component according to embodiments will be described with reference to the drawings. Note that the drawings referenced in the following description are schematic diagrams, and dimension ratios and the like in the drawings do not necessary correspond to actual dimension ratios and the like. Similarly, dimension ratios and the like in each drawing do not necessary correspond to those in the other drawings.

In the description of the second and subsequent embodiments, only a difference from the previously described embodiment is described basically. A matter that is not specifically mentioned may be assumed to be the same as that in the previously described embodiment.

First Embodiment

Overall Configuration of Electronic Component

Figure 1B:
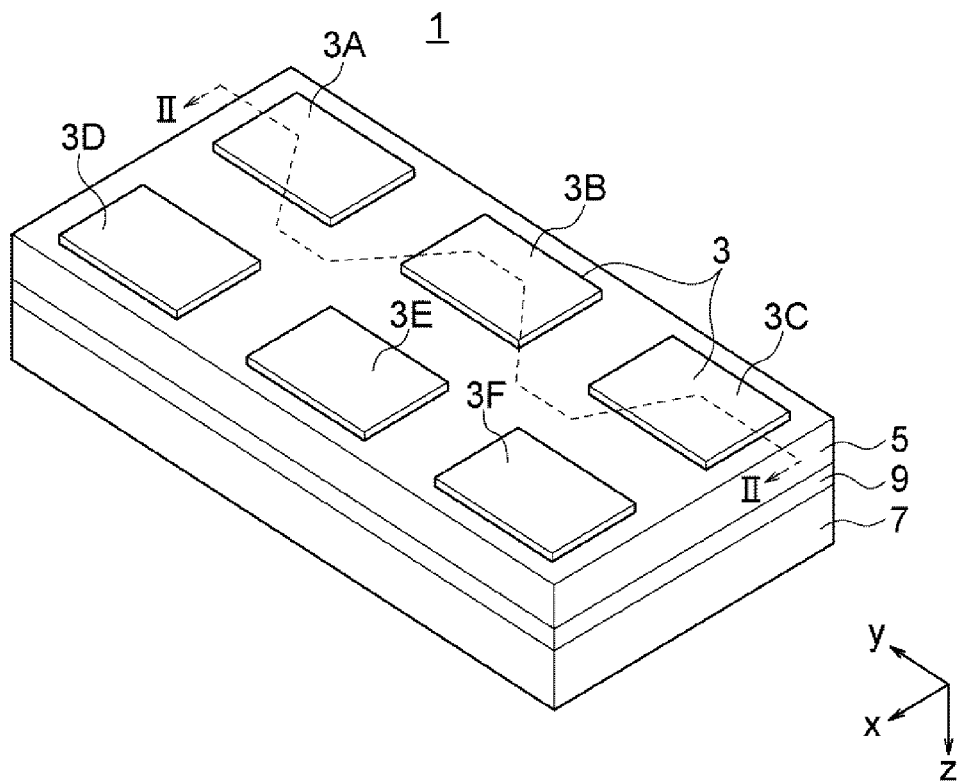

FIG. 1A is a perspective view illustrating the external appearance of an electronic component 1 according to a first embodiment when viewed from the top surface side, and FIG. 1B is a perspective view illustrating the external appearance of the electronic component 1 when viewed from the bottom surface side.

Although any direction may be defined as the upward direction or the downward direction of the electronic component 1, for the sake of convenience, a rectangular coordinate system xyz is defined, the positive side in a z direction is defined as the upward direction, and the term "top surface" or "bottom surface" is used accordingly. A plan view or a perspective plan view is a view in the z direction unless otherwise noted.

The electronic component 1 is formed, for example, in a substantially thin rectangular cuboid form. The electronic component 1 may have any appropriate size. For example, the length of one side in plan view is 1 mm or more and 5 mm or less, and the thickness is 0.3 mm or more and 2 mm or less (and is smaller than the short sides in plan view).

A plurality of external terminals 3A to 3F (hereinafter, A to F may be omitted) are exposed on the bottom surface of the electronic component 1. The electronic component 1 is disposed such that the bottom surface faces a mounting substrate not illustrated, and pads provided on the mounting substrate and the plurality of external terminals 3 are joined together via bumps not illustrated, thereby being mounted on the mounting substrate. The electronic component 1 receives, for example, a signal via any of the plurality of external terminals 3, performs a specific process for the received signal, and outputs the signal via any of the plurality of external terminals 3.

The number, positions, form, dimensions, and the like of the external terminals 3 may be set as appropriate in accordance with the internal configuration and the like of the electronic component 1. For example, four or more (six in the illustrated example) external terminals 3 are arranged along the outer edge of the bottom surface of the electronic component 1. Four external terminals 3 among the six external terminals 3 are located in the four corners of the bottom surface of the electronic component 1. As a matter of course, the external terminal 3 that is located close to the center of the bottom surface of the electronic component 1 may be provided. The shape of the external terminals 3 in plan view may be, for example, a rectangular shape (the illustrated example), a trapezoidal shape, or a round shape.

The electronic component 1 can be considered to include, for example, three layered (substrate-like) members stacked in the z direction. One of the three members is a main-body substrate 5 responsible for core functions of the electronic component 1. Another one of the three members is a terminal substrate 7 including the external terminals 3. The remaining one of the three members is an insulating joining member 9 that joins the main-body substrate 5 and the terminal substrate 7 together. Although the boundaries between the above-described three layers are externally visible in FIG. 1A and FIG. 1B, the three layers need not be externally observed.

Figure 2:
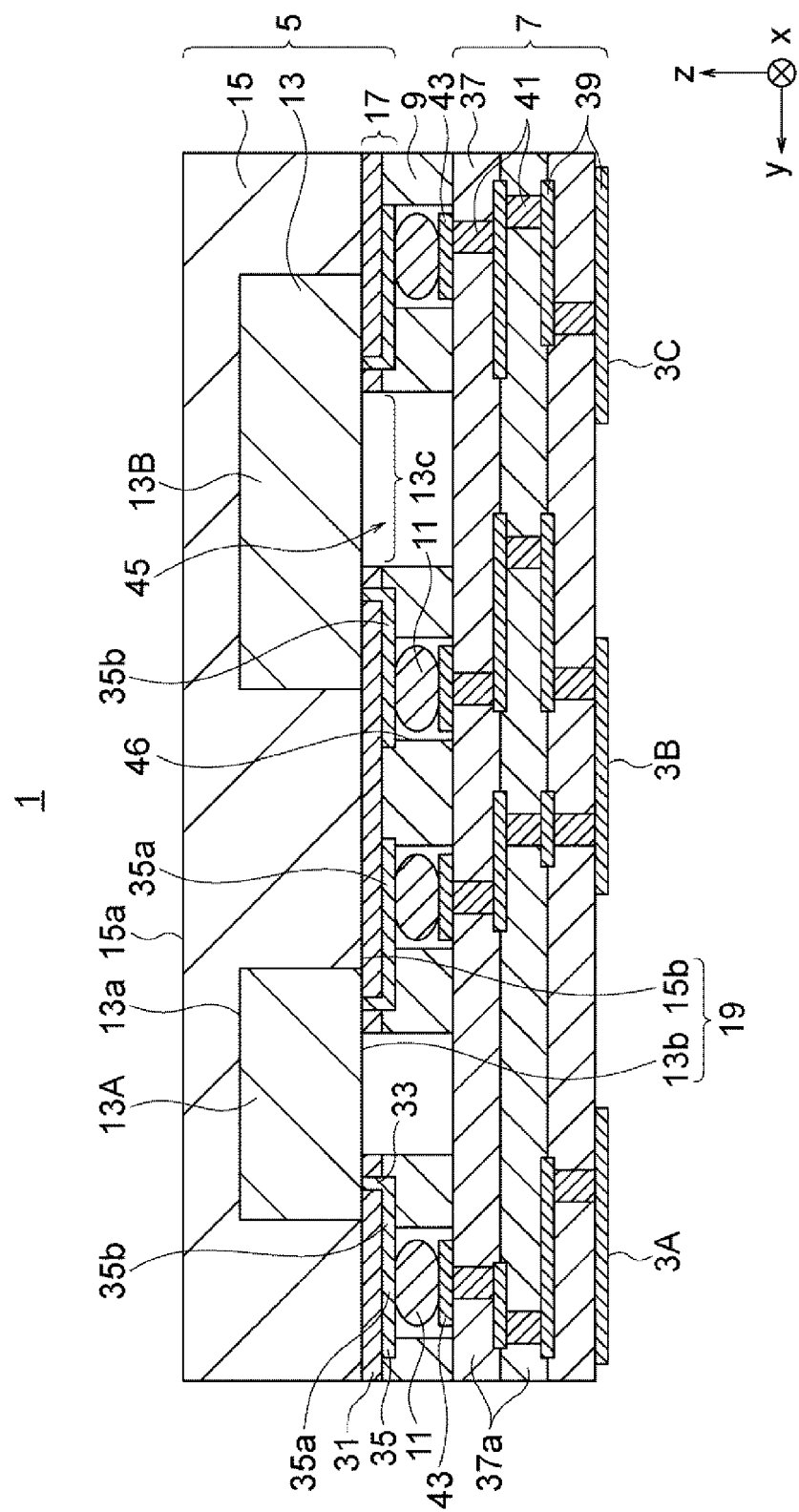
FIG. 2 is a schematic cross-sectional view cut along line II-II in FIG. 1B.

FIG. 2 is a schematic cross-sectional view cut along line II-II in FIG. 1B, where the +z direction corresponds to the upward direction in FIG. 2, as in FIG. 1A.

Between the main-body substrate 5 and the terminal substrate 7, one or more (usually, a plurality of) conductive bumps 11 are located in addition to the joining member 9. The bumps 11 join (fix) the main-body substrate 5 and the terminal substrate 7 together and electrically connect the main-body substrate 5 and the terminal substrate 7 to each other.

The main-body substrate 5 includes one or more (two in the illustrated example) electronic elements 13A and 13B (hereinafter, A and B may be omitted), an insulating surrounding member 15 that surrounds the electronic elements 13, and a rewiring layer 17 that is located on the bottom surfaces of the electronic elements 13 and the surrounding member 15. The electronic elements 13 are responsible for core functions of the electronic component 1. The surrounding member 15 contributes to protection and the like of the electronic elements 13. To the rewiring layer 17, the bumps 11 are joined to transfer electric signals between each electronic element 13 and the terminal substrate 7.

Electronic Element

Figure 3:
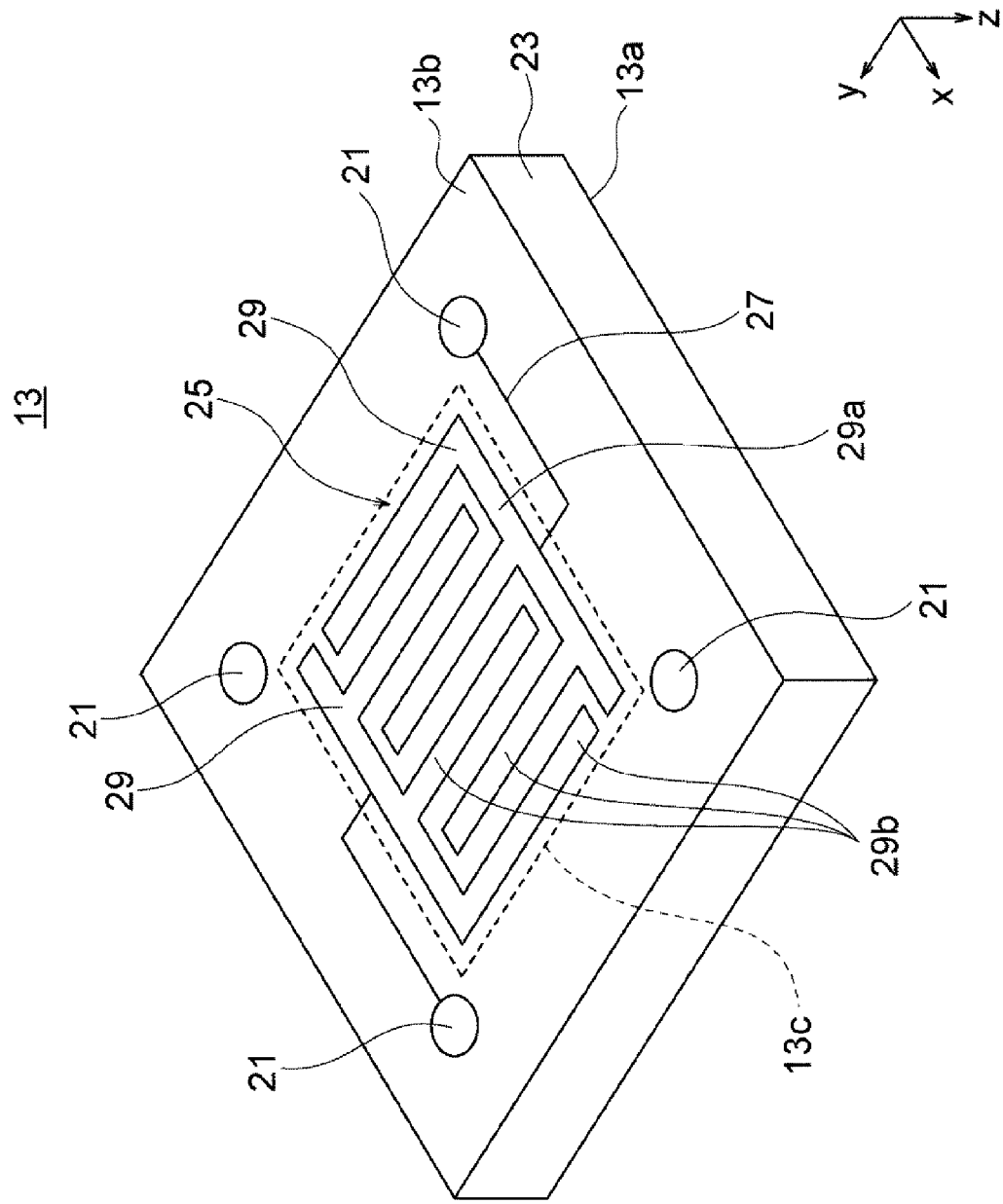
FIG. 3 is a schematic perspective view illustrating an example configuration of an electronic element included in the electronic component illustrated in FIG. 1A.

FIG. 3 is a schematic perspective view illustrating an example configuration of the electronic element 13. In contrast to FIG. 2, the +z direction corresponds to the downward direction in FIG. 3.

The electronic element 13 has a bottom surface 13b that faces the terminal substrate 7. The bottom surface 13b has a substantially flat shape. The electronic element 13 may have any appropriate form as a whole and any appropriate dimensions. In the illustrated example, the electronic element 13 has a substantially thin rectangular cuboid form. The electronic element 13 has a thickness of, for example, 0.20 mm or more and 0.25 mm or less.

When two or more electronic elements 13 are provided, the two or more electronic elements 13 may have the same form and/or dimensions or may have different forms and/or dimensions. In the example illustrated in FIG. 2, the thicknesses of the two electronic elements 13 are the same or relatively close to each other. For example, among all of the two or more electronic elements 13, the thickness of the thickest electronic element 13 is 1.3 times, 1.2 times, or 1.1 times the thickness of the thinnest electronic element 13 or less. The thicknesses of all of the two or more electronic elements 13 may be within the above-described example range of dimension (0.20 mm or more and 0.25 mm or less).

The electronic element 13 includes, on the bottom surface 13b, a plurality of element terminals 21 each constituted by a layered conductor. The electronic element 13 including the element terminals 21 as described above can be considered to be a surface-mountable chip component. The electronic element 13 of such a chip type may be a bare chip, a packaged chip, or a chip using wafer-level chip-scale packaging. This embodiment assumes an example of a bare chip or a chip close to a bare chip. The electronic element 13 of such a chip type may be an electronic element (general-purpose one) that is directly mountable on the mounting substrate not illustrated in a mode different from this embodiment or may be an electronic element configured so as to be suitable to the structure of the electronic component 1 of this embodiment.

The electronic element 13 may specifically have any appropriate configuration and functions. When two or more electronic elements 13 are provided, the two or more electronic elements 13 may be electronic elements of the same type based on a common basic principle (for example, both are SAW elements) or may be completely different electronic elements (for example, an SAW element and a semiconductor element). In this embodiment, an example mode in which both the electronic elements 13 are SAW elements is described.

The electronic element 13 that is an SAW element of a bare chip type includes, for example, an element substrate 23, at least one (only one is illustrated in FIG. 3) excitation electrode 25 provided on the bottom surface of the element substrate 23, the above-described element terminals 21 provided on the bottom surface of the element substrate 23, and element wiring lines 27 each connecting the excitation electrode 25 and a corresponding one of the element terminals 21 to each other. The bottom surface 13b of the electronic element 13 is constituted by the bottom surface of the element substrate 23 and a conductor layer (the excitation electrode 25 and the like) that overlaps the bottom surface of the element substrate 23.

Although not illustrated, in addition to the above, the electronic element 13 may include an insulating film that covers the excitation electrode 25 and a region, in the bottom surface of the element substrate 23, exposed from the excitation electrode 25 while allowing the element terminals 21 to be exposed. In this case, the bottom surface 13b of the electronic element 13 is mainly constituted by the insulating film. The insulating film may be a film for simply suppressing corrosion of the excitation electrode 25 or may be a film that produces an acoustically favorable effect.

The form and dimensions of the element substrate 23 are substantially the same as, for example, the form and dimensions of the electronic element 13. Therefore, the description of the form and dimensions of the electronic element 13 given above may be applied to the form and dimensions of the element substrate 23.

At least a surface (bottom surface) of the element substrate 23 on which the excitation electrode 25 is provided is made of a piezoelectric material. The piezoelectric material is made of, for example, a piezoelectric single crystal. The single crystal is, for example, a crystal ($SiO_2$), a lithium niobate ($LiNbO_3$) single crystal, or a lithium tantalite ($LiTaO_3$) single crystal. The cut angle may be set as appropriate in accordance with the type and the like of the SAW to be used.

For example, the element substrate 23 may be entirely made of a piezoelectric material (may be a piezoelectric substrate), may be constituted by a supporting substrate made of an appropriate material and a piezoelectric layer formed thereon, or may be constituted by a piezoelectric substrate and a supporting substrate bonded together. The side surfaces and the top surface (the surface on the +z side) of the element substrate 23 may be covered by an insulating layer or the like thinner than the element substrate 23. The electronic element 13 thus covered may be still considered to be a bare chip.

The excitation electrode 25 is an IDT (InterDigital Transducer) and includes a pair of comb-shaped electrodes 29. Each of the comb-shaped electrodes 29 includes a busbar 29a and a plurality of electrode fingers 29b extending from the busbar 29a. The pair of comb-shaped electrodes 29 are disposed so as to mesh with each other (such that the plurality of electrode fingers 29b are interposed between one another). FIG. 3 is a schematic diagram, and therefore, illustrates the comb-shaped electrodes 29 each having a small number of electrode fingers 29b. Actually, a number of electrode fingers 29b larger than the illustrated number may be provided. FIG. 3 illustrates the excitation electrode 25 having a typical form. Unlike the illustration, the excitation electrode 25 may be apodized or may be provided with a dummy electrode. The busbar 29a may be inclined relative to the SAW propagation direction.

FIG. 3 is a schematic diagram, and therefore, illustrates only one excitation electrode 25. Actually, a plurality of excitation electrodes 25 may be provided. Further, reflector electrodes may be provided on both sides of the excitation electrode 25 in the SAW propagation direction (the x direction in FIG. 3). The at least one excitation electrode 25 may constitute, for example, an SAW resonator, a ladder-type resonator filter, a dual- or multiple-mode resonator filter, and/or a demultiplexer.

When a signal is input to the excitation electrode 25, the signal is converted to an SAW, the SAW propagates along the bottom surface of the element substrate 23 in a direction (x direction) orthogonal to the electrode fingers 29b, the SAW is converted to a signal, and the signal is output from the excitation electrode 25. In this process, the signal is subjected to filtering and the like. Propagation of the SAW involves vibration of the bottom surface 13b of the electronic element 13, and therefore, a region, in the bottom surface 13b, in which the excitation electrode 25 (and the reflector electrodes) are disposed is a vibration region 13c that vibrates in response to an electric signal input to the electronic element 13.

When a plurality of excitation electrodes 25 are provided, only one vibration region 13c including all of the plurality of excitation electrodes 25 (and the reflector electrodes) may be defined on the bottom surface 13b or a plurality of vibration regions 13c each including at least one excitation electrode 25 may be defined on the bottom surface 13b. In the description of this embodiment, the former definition is used for the sake of convenience. In this case, the vibration region 13c may be defined, for example, as a smallest rectangular shape or a smallest elliptic shape (a simple shape having no indentations on the outer edge) that includes all of the excitation electrodes 25 or as a shape having indentations and projections on the outer edge. The illustrated example schematically illustrates only one excitation electrode 25, and therefore, the vibration region 13c has a rectangular shape.

The numbers, positions, and the like of the element terminals 21 and the element wiring lines 27 may be set as appropriate in accordance with the number, disposition, and the like of one or more excitation electrodes 25. In the illustrated example, four element terminals 21 are provided in the four corners of the element substrate 23. From a different point of view, the plurality of element terminals 21 are disposed so as to surround the vibration region 13c. The form and dimensions of the element terminals 21 may be set as appropriate. As understood from a description given below, this embodiment does not assume that the element terminals 21 are each joined to the conductive bump, and therefore, the size of the element terminals 21 may be made smaller than a typical size.

In the illustrated example, only two element terminals 21 among the four element terminals 21 are connected to the excitation electrode 25, and the remaining two element terminals 21 are electrically floated. The element terminals 21 (dummy terminals) that are electrically floated contribute, for example, to joining of the electronic element 13 and the mounting substrate not illustrated together when the electronic element 13 is mounted on the mounting substrate in a mode different from this embodiment. Note that in this embodiment, such dummy terminals need not be provided, or may be excluded from the definition of the element terminals when the dummy terminals are provided.

The excitation electrode 25, the element terminals 21, and the element wiring lines 27 (the conductor layer that overlaps the bottom surface of the element substrate 23) are made of, for example, appropriate metal, such as an Al—Cu alloy. The excitation electrode 25, the element terminals 21, and the element wiring lines 27 may be made of the same material or may be made of different materials. Each of the excitation electrode 25, the element terminals 21, and the element wiring lines 27 may be made of one type of material or may be made of a plurality of materials such that a plurality of layers made of different materials are stacked. The element terminals 21 may each include a layer made of a material the same as the material of the excitation electrode 25 and the element wiring lines 27 and a layer made of another material and covering the above-described layer.

Surrounding Member

Referring back to FIG. 1 and FIG. 2, the surrounding member 15 has a bottom surface 15b that faces the terminal substrate 7. For example, the external form of the surrounding member 15 (the form including the electronic elements 13) is substantially a thin rectangular cuboid form, and the surrounding member 15 has a top surface 15a and the bottom surface 15b on a side opposite to the top surface 15a. The surrounding member 15 is in close contact with the electronic elements 13 so as to surround the electronic elements 13 while allowing the bottom surface 13b of each electronic element 13 to be exposed from the bottom surface 15b. Therefore, the bottom surfaces 13b and the bottom surface 15b constitute a substantially flat joint surface 19.

More specifically, the surrounding member 15 covers the side surfaces of each electronic element 13 so as to entirely surround the electronic element 13 and also covers a top surface 13a of the electronic element 13. That is, the electronic element 13 is embedded in the surrounding member 15 with the bottom surface 13b being exposed. The top surface 15a of the surrounding member 15 constitutes the entire top surface of the electronic component 1. The surfaces of the electronic element 13 covered by the surrounding member 15 are basically in close contact with the surrounding member 15 (are bonded to the surrounding member 15).

Although not illustrated, the surrounding member 15 may cover only the side surfaces of each electronic element 13 and allow the top surface 13a of the electronic element 13 to be exposed. In this case, the surrounding member 15 may cover the side surfaces of the electronic element 13 entirely in the vertical direction or may cover only a portion of each side surface of the electronic element 13 closer to the bottom surface 13b. The surrounding member 15 need not cover the side surfaces of each electronic element 13 so as to entirely surround the electronic element 13. For example, the surrounding member 15 may have a form that does not include a portion located between the two electronic elements 13.

As the material of the surrounding member 15, for example, various materials typically used to seal electronic elements may be used. The material of the surrounding member 15 may be an organic material, an inorganic material, or a combination thereof. Examples of the organic material include a resin. Examples of the inorganic material include an amorphous material that contains a plurality of inorganic particles bound together.

When the material of the surrounding member 15 is a resin, the resin is, for example, a thermosetting resin. Examples of the thermosetting resin include an epoxy resin, a phenol resin, a melamine resin, a urea resin, and an unsaturated polyester resin. In the resin, a filler made of insulating particles may be mixed. The filler is made of, for example, a material having a coefficient of linear expansion lower than that of the resin. Examples of the material of the insulating particles include silica, alumina, phenol, polyethylene, a glass fiber, and graphite.

Although not illustrated, the surrounding member 15 may be made of different materials in two or more layers. For example, the surrounding member 15 may include an insulating film that is in close contact with the side surfaces and the top surface 13a of each electronic element 13 and with the rewiring layer 17 and a mold resin that covers the insulating film.

The dimensions of the surrounding member 15 may be set as appropriate. For example, the thickness of the surrounding member 15 above the top surface 13a of each electronic element 13 may be smaller than, equal to, or larger than the thickness of the electronic element 13. Similarly, the thickness of the surrounding member 15 between the side surface of each electronic element 13 and the side surface of the surrounding member 15 may be smaller than, equal to, or larger than the thickness of the electronic element 13 and/or the length of one side of the electronic element 13.

Rewiring Layer

The rewiring layer 17 includes at least one conductor layer 35. The conductor layer 35 includes a main-body terminal 35a that is electrically connected to one of the element terminals 21 of the electronic element 13 (FIG. 3). When the main-body terminal 35a and the bump 11 are joined together, the electronic element 13 and the terminal substrate 7 are electrically connected to each other. Therefore, for example, the bump 11 can be disposed at a position different from the position of the element terminal 21 in perspective plan view.

More specifically, in the illustrated example, the rewiring layer 17 includes an insulating layer 31 that overlaps the joint surface 19 constituted by the electronic elements 13 and the surrounding member 15, a plurality of through conductors 33 that pass through the insulating layer 31, and the conductor layer 35 that overlaps the insulating layer 31. Each of the plurality of through conductors 33 overlaps a corresponding one of the plurality of element terminals 21. The conductor layer 35 includes, in addition to a plurality of main-body terminals 35a, a plurality of wiring patterns 35b each connecting a corresponding one of the plurality of through conductors 33 and a corresponding one of the plurality of main-body terminals 35a to each other.

Although not illustrated, the rewiring layer 17 need not include the insulating layer 31 and the through conductors 33 but may include only the conductor layer 35 that directly overlaps the joint surface 19. In contrast, the rewiring layer 17 may include two or more insulating layers 31 and/or two or more conductor layers 35. Although the through conductors 33 are considered to be portions separate from the conductor layer 35 for the sake of convenience and the description has been given, the through conductors 33 may be made of a material the same as the material of the conductor layer 35 and may be formed simultaneously with the conductor layer 35.

The shape of the rewiring layer 17 in plan view as a whole may be any appropriate shape. In the illustrated example, the rewiring layer 17 (more specifically, the insulating layer 31) entirely overlaps the joint surface 19 basically. Note that the rewiring layer 17 is not disposed in a region that overlaps the vibration region 13c. Accordingly, the probability that the rewiring layer 17 affects the vibration characteristics of the vibration region 13c is reduced.

Although not illustrated, there may be a region, other than the vibration region 13c, in which the rewiring layer 17 is not disposed. For example, the outer edge of the rewiring layer 17 may be located closer to the center than the outer edge of the joint surface 19. In contrast, the rewiring layer 17 may include the insulating layer 31 that covers the vibration region 13c. The insulating layer 31 thus configured may only contribute to simple protection of the excitation electrode 25 from corrosion or may produce an acoustically favorable effect.

The thickness of the rewiring layer 17 may be set as appropriate. For example, the thickness of the rewiring layer 17 is sufficiently smaller than the thickness of the electronic element 13 and the thickness of the joining member 9. For example, when the thickness of the rewiring layer 17 in the thickest portion and the thickness of the joining member 9 in the thickest portion are compared with each other, the former thickness is one-half or one-fifth of the latter thickness or less. However, the rewiring layer 17 that is relatively thick may be provided.

The material of the insulating layer 31 may be an organic material, an inorganic material, or a combination thereof or may be a publicly known material used in a rewiring layer of a semiconductor element and/or in a circuit board. The insulating layer 31 may be made of the same material as a whole or may be made of a plurality of materials such that a plurality of layers made of different materials are stacked.

Regarding the shape and extent of the insulating layer 31 in plan view, the description of the shape and extent of the rewiring layer 17 in plan view as a whole given above may be basically quoted except holes in which the through conductors 33 are disposed respectively. The insulating layer 31 that overlaps the joint surface 19 has openings (their reference numerals are omitted) each overlapping a corresponding one of the element terminals 21. The openings have a shape and size substantially the same as the shape and size of the element terminals 21 in plan view. The thickness of the insulating layer 31 may be set as appropriate.

The material of the through conductors 33 may be, for example, any appropriate metal and may be the same as or different from the material of the conductor layer 35 to which the through conductors 33 are connected. The through conductors 33 have, for example, a shape and size substantially the same as those of the element terminals 21 in plan view.

The conductor layer 35 may be made of, for example, any appropriate metal and may be made of a publicly known material used in a rewiring layer of a semiconductor element and/or in a circuit board. The conductor layer 35 may be made of one type of material or may be made of a plurality of materials such that a plurality of layers made of different materials are stacked. The conductor layer 35 may have any thickness.

The boundary between the main-body terminal 35a and the wiring pattern 35b may or may not be distinguishable. Examples of a mode in which the boundary is distinguishable include a mode in which the main-body terminal 35a has a width wider than the width of the wiring pattern 35b in plan view. The examples include a mode in which the main-body terminal 35a includes a layer made of a material the same as the material of the wiring pattern 35b and a layer made of another material suitable to joining to the bump 11 and covering the above-described layer.

Terminal Substrate

The terminal substrate 7 is constituted by, for example, a rigid printed wiring board. The terminal substrate 7 needs to have a configuration similar to those of various publicly known boards except its specific shape, dimensions, and the like. The terminal substrate 7 may be constituted by a both-side board that includes only two conductor layers on the front side and the back side in total or may be constituted by a multilayer board that includes three or more conductor layers. In this embodiment, a description is given of, for example, a multilayer board.

The terminal substrate 7 is formed in, for example, a substantially thin rectangular cuboid form. The shape and dimensions of the terminal substrate 7 in plan view are substantially the same as the shape and dimensions of the main-body substrate 5 in plan view. For example, the terminal substrate 7 has a shape and size such that the main-body substrate 5 fits in the terminal substrate 7 in perspective plan view, and the difference in area between the terminal substrate 7 and the main-body substrate 5 is 40%, 20%, or 10% of the area of the main-body substrate 5 or less. However, the shape and/or size of the terminal substrate 7 and those of the main-body substrate 5 in plan view may be different from each other. The thickness of the terminal substrate 7 may be thinner than, equal to, or thicker than the thickness of the main-body substrate 5.

The terminal substrate 7 includes, for example, an insulating substrate 37, and conductors provided in or on the insulating substrate 37. The conductors include, for example, a plurality of conductor layers 39 located on the top surface, in the inside, and on the bottom surface of the insulating substrate 37 and a plurality of through conductors 41 located inside the insulating substrate 37 and each connecting corresponding ones of the conductor layers 39 to each other.

The insulating substrate 37 forms a main portion of the external form of the terminal substrate 7, and the description of the shape and dimensions of the terminal substrate 7 given above may be quoted for the shape and dimensions of the insulating substrate 37. The insulating substrate 37 is constituted by a plurality of stacked insulating layers 37a. The thickness, the number, and the like of the stacked insulating layers 37a may be set as appropriate. The insulating substrate 37 (insulating layers 37a) may be made of, for example, a resin, ceramic, and/or an amorphous inorganic material. The insulating substrate 37 (insulating layers 37a) may be made of a single material or may be made of a composite material, such as a substrate made of a base material impregnated with a resin.

The conductor layer 39 that overlaps the top surface of the insulating substrate 37 includes a plurality of pads 43 each of which is joined to a corresponding one of the bumps 11. The conductor layer 39 that overlaps the bottom surface of the insulating substrate 37 includes the plurality of external terminals 3. The conductor layer 39 that is sandwiched between the insulating layers 37a (a wiring pattern included in the conductor layer) and the plurality of through conductors 41 each passing through a corresponding one of the insulating layers 37a contribute to connecting of the plurality of pads 43 and the external terminals 3 to each other. The shapes and dimensions of the plurality of conductor layers 39 and the plurality of through conductors 41 may be set as appropriate.

The above-described conductors in a plurality of portions may be made of the same material or may be made of different materials. The materials may be any appropriate metal, and may be made of one type of material or may be made of a plurality of materials such that a plurality of layers made of different materials are stacked. The pads 43 need to have a form suitable to joining to the bumps 11. Similarly, the external terminals 3 need to have a form suitable to joining to bumps for mounting the electronic component 1 on the mounting substrate not illustrated.

As described above, the positions and the like of the external terminals 3 may be set as appropriate. In relation to the main-body substrate 5, for example, some or all of the external terminals 3 (all in this embodiment) overlap the main-body substrate 5 (joint surface 19) in perspective plan view. Each of the external terminals 3 overlaps the main-body substrate 5 such that the entire area may overlap the main-body substrate 5 (the illustrated example) or a partial area may overlap the main-body substrate 5.

Although not illustrated, the terminal substrate 7 may include an electronic element constituted by the conductor layer 39 and/or the through conductor 41. Examples of such an electronic element include a resistor, an inductor, a capacitor, a resonator, and a filter. The terminal substrate 7 may include a chip component mounted on the top surface or accommodated therein.

Joining Member

The joining member 9 is a layered member having a substantially uniform thickness and has a first through hole 45 and a second through hole 46 that pass through the joining member 9 from the main-body substrate 5 to the terminal substrate 7. The first through hole 45 overlaps the vibration region 13*c* of the electronic element 13 in perspective plan view and contributes to reduction of an effect of the joining member 9 on vibration of the vibration region 13*c*. The second through hole 46 overlaps the position at which the bump 11 is disposed in perspective plan view and allows the bump 11 to be disposed between the main-body substrate 5 and the terminal substrate 7.

The first through hole 45 and the second through hole 46, for example, do not open into each other and are separately sealed. A portion, in the first through hole 45, and a portion, in the second through hole 46, in which a material, such as the bump, is not disposed (portions not hatched in FIG. 2) may be under vacuum (under a reduced pressure lower than atmospheric pressure) or may be filled with an appropriate gas (for example, an inert gas).

In a cross section orthogonal to the main-body substrate 5 and the terminal substrate 7 as illustrated in FIG. 2, the inner surface (wall surface) of the first through hole 45 and that of the second through hole 46 may have any appropriate shape and the like. For example, the inner surfaces may be orthogonal to the main-body substrate 5 and the terminal substrate 7 or may be inclined, and may be flat surfaces or may be curved surfaces.

The shape and dimensions of the outer edge of the joining member 9 may be substantially the same as the shape and dimensions of the outer edge of the main-body substrate 5 and those of the outer edge of the terminal substrate 7. However, the shape and/or size of the outer edge of the joining member 9 may be different from the shape and/or size of the outer edge of the terminal substrate 7 and/or those of the outer edge of the main-body substrate 5. The thickness of the joining member 9 may be set as appropriate. For example, the thickness of the joining member 9 is thinner than the thickness of the terminal substrate 7 and the thickness of the electronic element 13. However, the thickness of the joining member 9 can be made thicker than the thickness of the terminal substrate 7 and the thickness of the electronic element 13.

The joining member 9 is made of, for example, a resin and the like as described below and is bonded to the main-body substrate 5 and bonded to the terminal substrate 7 to thereby join the main-body substrate 5 and the terminal substrate 7 together. More specifically, in the illustrated example, the joining member 9 is bonded to the rewiring layer 17 (mainly, the insulating layer 31). However, the joining member 9 may be bonded to the electronic element 13 and/or the surrounding member 15 in a region in which the rewiring layer 17 is not disposed.

Bump

The bump 11 is interposed between the main-body terminal 35*a* and the pad 43 and joins the main-body terminal 35*a* and the pad 43 together. The bump 11 is made of, for example, solder. The solder may be lead-containing solder, such as Pb—Sn alloy solder, or may be lead-free solder, such as Au—Sn alloy solder, Au—Ge alloy solder, Sn—Ag alloy solder, or Sn—Cu alloy solder. Note that the bump 11 may be made of a conductive bonding agent. The conductive bonding agent may be an agent made of a resin in which a conductive filler is mixed. The resin is, for example, a thermosetting resin.

Connection of Two Electronic Elements

Both the electronic elements 13A and 13B are electrically connected to the same external terminal 3 (here, 3B). More specifically, one of the plurality of pads 43 joined to the electronic element 13A via the bump 11 and one of the plurality of pads 43 joined to the electronic element 13B via the bump 11 are connected to the external terminal 3B via separate electric paths each constituted by wiring patterns (the conductor layers 39) and the through conductors 41 of the terminal substrate 7. Although not illustrated, the electric paths extending from the two pads 43 to the external terminal 3B may join together on the top surface or in the inside of the terminal substrate 7 on the near side of the external terminal 3B.

The electronic component 1 including the two or more electronic elements 13 that are electrically connected to the same external terminal 3 as described above is, for example, a demultiplexer (duplexer). In this case, the external terminal 3B is electrically connected to an antenna not illustrated via the mounting substrate on which the electronic component 1 is mounted. One of the electronic elements 13A and 13B (13A in the following description) constitutes a transmission filter that allows only an electric signal having a frequency that is within a passband for transmission to pass therethrough. The other of the electronic elements 13A and 13B (13B in the following description) constitutes a reception filter that allows only an electric signal having a frequency that is within a passband for reception to pass therethrough. The passband for transmission and the passband for reception do not overlap. These passbands need to be set in accordance with various standards. An example operation of the electronic component 1 that functions as the demultiplexer is described.

To the external terminal 3A that is electrically connected to the electronic element 13A, for example, a transmission signal that includes information to be transmitted, that is modulated, and that has an increased frequency (that is converted to a radio-frequency signal having a carrier frequency) is input. Note that the transmission signal may be an unbalanced signal input to the external terminal 3A or may be a balanced signal input to the external terminal 3A and to another external terminal 3 (other than those connected to the electronic element 13B). The electronic element 13A removes an unwanted component in a range outside the passband for transmission from the transmission signal input via the external terminal 3A (and the other external terminal 3), and thereafter, outputs the transmission signal to the external terminal 3B. The signal output to the external terminal 3B is, for example, converted to a radio signal (radio wave) and transmitted via the antenna not illustrated.

A radio signal received by the antenna not illustrated is converted to an electric signal (reception signal) by the antenna and input to the external terminal 3B. The electronic element 13B removes an unwanted component in a range outside the passband for reception from the reception signal from the external terminal 3B, and thereafter, outputs the reception signal to the external terminal 3C. Note that the reception signal output from the electronic element 13B may be an unbalanced signal output to the external terminal 3C or may be a balanced signal output to the external terminal 3C and another external terminal 3 (other than those connected to the electronic element 13A).

Shapes and Positions of Through Holes and the Like in Perspective Plan View

Figure 4:
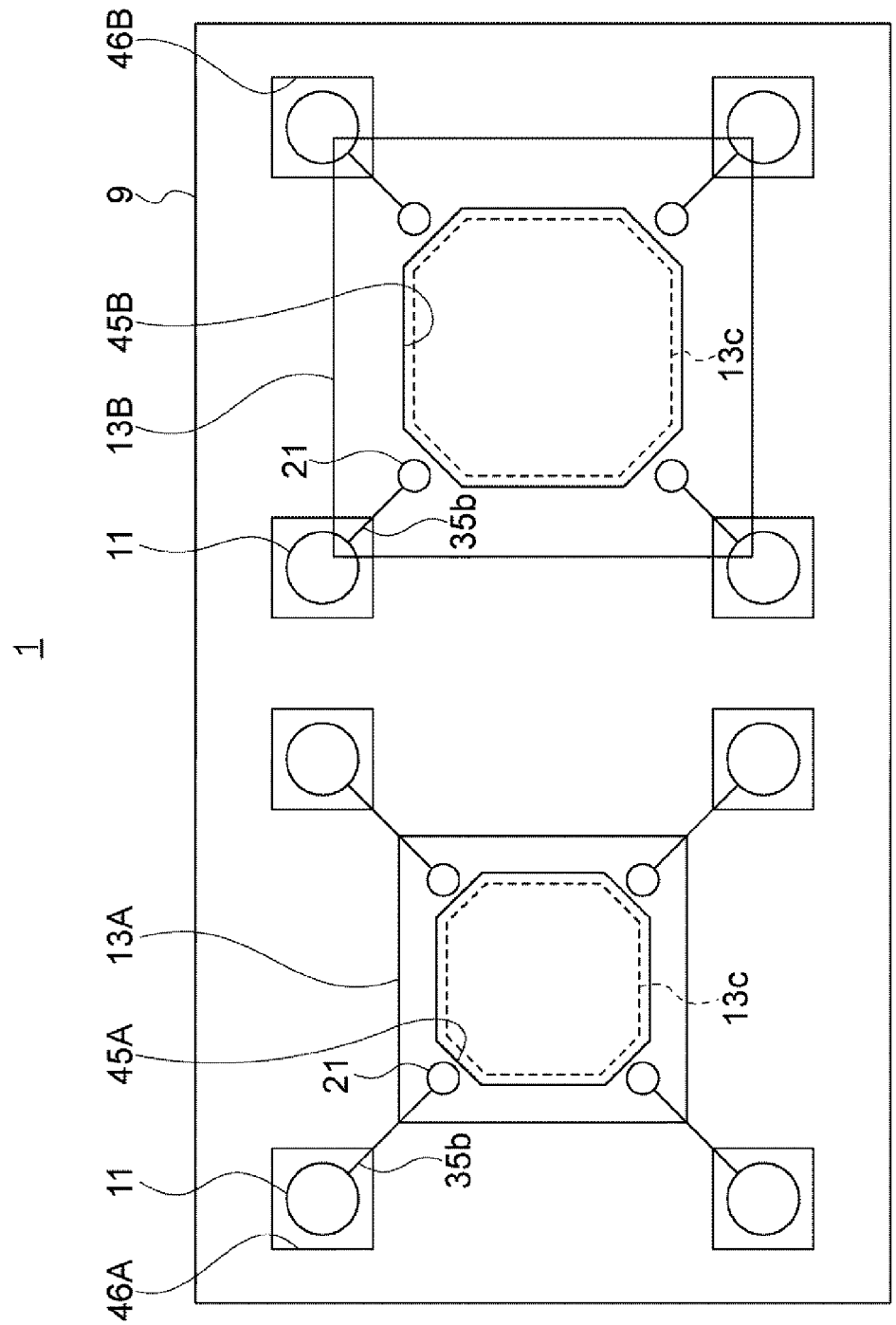
FIG. 4 is a schematic perspective plan view of the electronic component illustrated in FIG. 1A.

FIG. 4 is a schematic perspective plan view of the electronic component 1. FIG. 4 illustrates the outer edges of the electronic elements 13, the element terminals 21, the vibration regions 13c, the bumps 11, the outer edge of the joining member 9, and the first through holes 45 (45A and 45B) and the second through holes 46 (46A and 46B) of the joining member 9. The wiring pattern 35b that connects the element terminal 21 and the main-body terminal 35a to each other is schematically illustrated as a straight line.

Note that each vibration region 13c in FIG. 4 is illustrated so as to be slightly larger than that in FIG. 3. Specifically, each vibration region 13c is made larger than that in FIG. 3 so as to include a portion located between the element terminals 21 adjacent to each other along the outer edge of the element substrate 23.

As understood from FIG. 2, in this embodiment, the geometric shape that indicates the outer edge of the joining member 9 in FIG. 4 may be considered to indicate the outer edge of the surrounding member 15 and the outer edge of the terminal substrate 7. The geometric shape that indicates the bump 11 in FIG. 4 may be considered to indicate the main-body terminal 35a of the main-body substrate 5 and the pad 43 of the terminal substrate 7. Therefore, in the following description, a description of the size and positions of the bumps 11 in perspective plan view may be quoted for the size and positions of the main-body terminals 35a and those of the pads 43.

Note that as described above, the boundary between the main-body terminal 35a and the wiring pattern 35b may be non-distinguishable. The main-body terminals 35a can be sufficiently made larger than the bumps 11. Therefore, paradoxically, a region, in the conductor layer 35, that overlaps the bump 11 in perspective plan view may be defined as the main-body terminal 35a. Similarly, regarding the pads 43, a region, in the conductor layer 39 that is located on the top surface of the terminal substrate 7, that overlaps the bump 11 in perspective plan view may be defined as the pad 43.

The joining member 9 has, as the first through holes 45, for example, the two first through holes 45A and 45B. The first through hole 45A corresponds to the electronic element 13A and overlaps the vibration region 13c of the electronic element 13A in perspective plan view. The first through hole 45B corresponds to the electronic element 13B and overlaps the vibration region 13c of the electronic element 13B in perspective plan view.

In the illustrated example, one vibration region 13c is provided (and/or defined) per electronic element 13, and one first through hole 45 is provided per electronic element 13. However, two or more vibration regions 13c may be provided (and/or defined) per electronic element 13, and a plurality of first through holes 45 may be provided per electronic element 13.

The size of the first through hole 45 in plan view may be set as appropriate. In the illustrated example, the first through hole 45 fits in the electronic element 13 in perspective plan view. However, a portion of the first through hole 45 can be located outside the electronic element 13. Further, the area of the first through hole 45 may be close to the area of the vibration region 13c or may be sufficiently large.

The shape of the first through hole 45 in plan view may be set as appropriate. In the illustrated example, the shape of the first through hole 45 in plan view is a shape similar to the vibration region 13c and slightly larger than the vibration region 13c. Alternatively, for example, the shape of the first through hole 45 may be a rectangular shape, a round shape, or an elliptic shape. When a plurality of excitation electrodes 25 are provided, the first through hole 45 may have an outer edge having indentations and projections such that a portion of the outer edge is indented between the excitation electrodes 25 adjacent to each other.

The joining member 9 has, as the second through holes 46, for example, a plurality of second through holes 46A and a plurality of second through holes 46B. The plurality of second through holes 46A correspond to the electronic element 13A and each accommodate the bump 11 that is electrically connected to the electronic element 13A. Similarly, the plurality of second through holes 46B correspond to the electronic element 13B and each accommodate the bump 11 that is electrically connected to the electronic element 13B.

In the illustrated example, the second through hole 46 is provided for each bump 11. That is, one second through hole 46 accommodates one bump 11. However, the second through hole 46 can be made such that one second through hole 46 accommodates two or more bumps 11.

The second through hole 46 accommodates the bump 11, and therefore, has a size larger than or equal to the size of the bump 11 in perspective plan view as a matter of course. In the illustrated example, the second through hole 46 is made larger than the bump 11 in perspective plan view. The area of the second through hole 46 in perspective plan view may be, for example, one time, 1.2 times, or 1.5 times the area of the bump 11 or more (projection area, hereinafter, the same applies to an area in a case of a perspective plan view) and five times, twice, or 1.5 times the area of the bump 11 or less, and any of the above-described lower limits and any of the above-described upper limits may be combined as appropriate. As a matter of course, the area of the second through hole 46 may be larger than the above-described example upper limits.

As described above, in the illustrated example, the second through hole 46 is made larger than the bump 11 in perspective plan view, and therefore, from a different point of view, a gap is provided between the bump 11 and the second through hole 46. For example, the gap entirely surrounds the bump 11. In other words, the entire surface of the bump 11 is apart from the inner surface of the second through hole 46. In this case, the distance between the bump 11 and the second through hole 46 (the shortest distance, hereinafter, the same applies unless otherwise noted) may be set as appropriate. For example, the distance may be less than one-half or equal to or greater than one-half of the diameter of a circle that corresponds to the bump 11 in perspective plan view. Unlike the above description, a portion of the surface of the bump 11 may be in contact with a portion of the inner surface of the second through hole 46 (the gap may be locally provided).

The shape of the second through hole 46 in plan view may be set as appropriate. In the illustrated example, the shape of the second through hole 46 in plan view is a rectangular shape. Alternatively, for example, the shape of the second through hole 46 may be a round shape (from a different point of view, a shape similar to the bump 11) or an elliptic shape. In perspective plan view, the centroid of the second through hole 46 and the centroid of the bump 11 substantially correspond to each other. Note that the centroid is a point at which the first moment of area relative to any axis that passes through the point is equal to zero.

The second through hole 46 extends outside the electronic element 13 in perspective plan view. In other words, at least a portion of the second through hole 46 overlaps the bottom surface 15b of the surrounding member 15. In the illustrated example, the second through hole 46A that corresponds to the electronic element 13A is located outside the electronic element 13A in whole. The second through hole 46B that corresponds to the electronic element 13B is located outside the electronic element 13B only in part.

The second through hole 46 extends outside the electronic element 13, and therefore, at least a portion of the bump 11 (from a different point of view, the main-body terminal 35a and the pad 43) can be located outside the electronic element 13. For example, in the illustrated example, each of the plurality of bumps 11 corresponding to the electronic element 13A is located outside the electronic element 13A in whole. Each of the plurality of bumps 11 corresponding to the electronic element 13B is located outside the electronic element 13B in part.

As for the bumps 11 corresponding to the electronic element 13B, when a portion of each bump 11 is located outside the electronic element 13, the size of the portion located outside may be set as appropriate. For example, the area of the portion in perspective plan view may be less than one-half, equal to or greater than one-half, or equal to or greater than two-thirds of the area of the bump 11.

The positions of the bumps 11 relative to the electronic element 13 may be set as appropriate. For example, the plurality of bumps 11 may be disposed so as to surround the electronic element 13 (the illustrated example) or may be disposed only on one side in a specific direction of the electronic element 13. In the former case, the plurality of bumps 11 may be located near the corners of the electronic element 13 respectively (on the extensions of the diagonal lines) (the illustrated example) or may be located on both sides in a direction in which a pair of sides of the electronic element 13 face each other.

The positional relationship between the element terminal 21 and the bump 11 that are electrically connected to each other may be set as appropriate. In the illustrated example, the element terminal 21 and the bump 11 that are located near the same corner of the electronic element 13 are electrically connected to each other. From a different point of view, each of the plurality of element terminals 21 and a corresponding one of the plurality of bumps 11 are connected to each other such that the plurality of wiring patterns 35b do not cross each other. However, when, for example, the rewiring layer 17 includes two or more conductor layers 35, connections in which the plurality of wiring patterns 35b cross each other are possible.

As described above, the plurality of element terminals 21 may include a dummy terminal that is electrically floated. The element terminal 21 that is a dummy terminal need not be electrically connected to any bump 11 or may be electrically connected to the bump 11 that is electrically floated. The through conductor 33, the main-body terminal 35a, the bump 11, and/or the pad 43 that correspond to a dummy terminal need not be provided.

The element terminals 21 of the electronic element 13 fit inside the outer edge of the electronic element 13 (element substrate 23) in perspective plan view as a matter of course. Therefore, as understood from the above description, at least portions of the bumps 11 are located outside and farther from the electronic element 13 than the element terminals 21 in perspective plan view. Further, in the illustrated example, the bumps 11 are located farther from the vibration region 13c than the element terminals 21. For example, when the element terminal 21 and the bump 11 that are electrically connected to each other are compared with each other, the distance between the bump 11 and the vibration region 13c is 1.2 times, twice, or five times the distance between the element terminal 21 and the vibration region 13c or more.

In the illustrated example, the bumps 11 are made larger than the element terminals 21 in perspective plan view. For example, when the bump 11 and the element terminal 21 that are electrically connected to each other are compared with each other, the area of the bump 11 is 1.2 times, twice, or five times the area of the element terminal 21 or more in perspective plan view.

Material of Joining Member

Figure 5A:
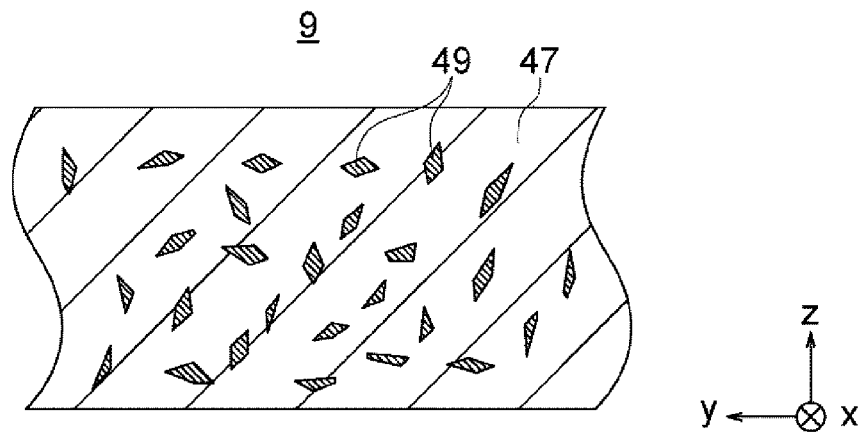
FIG. 5A, FIG. 5B, and FIG. 5C are schematic diagrams illustrating some example materials of a joining member in the electronic component illustrated in FIG. 1A.
Figure 5B:
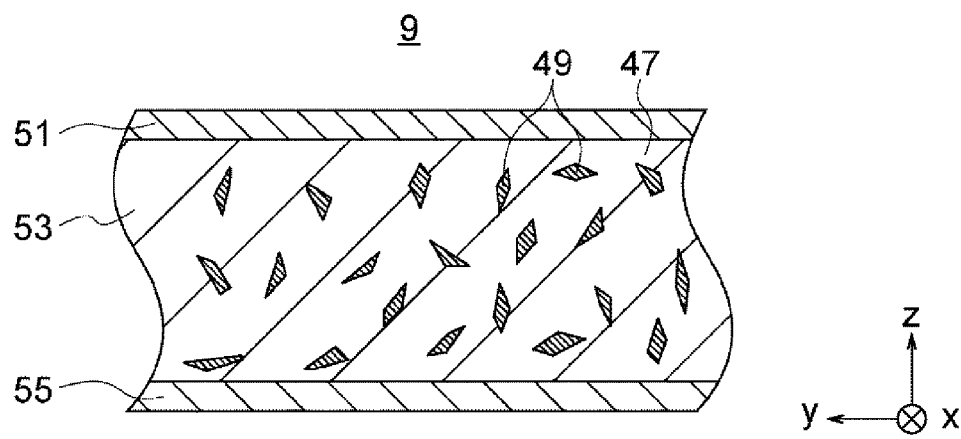
Figure 5C:
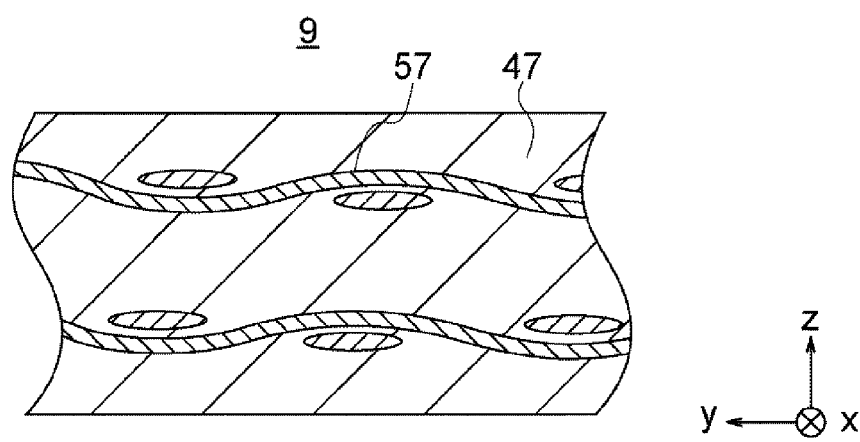

The material of the joining member 9 may be an organic material, an inorganic material, or a combination thereof. The material of the joining member 9 may be a material made of a base material in which a filler is mixed or may be made of a plurality of stacked layers made of different materials. FIG. 5A to FIG. 5C are schematic diagrams illustrating example materials of the joining member 9.

In the example illustrated in FIG. 5A, the joining member 9 includes a resin 47 as a base material and glass frit particles 49 as a filler.

The resin 47 is, for example, a thermosetting resin. Examples of the thermosetting resin include an epoxy resin, a phenol resin, a melamine resin, a urea resin, and an unsaturated polyester resin. When the surrounding member 15 is made of a resin, the resin 47 may be a resin the same as or different from the resin of the surrounding member 15.

Glass that makes up the glass frit particles 49 is glass that contains silicate as a main ingredient, and is silica glass, soda-lime glass, or borosilicate glass. The glass has, for example, a coefficient of linear expansion lower than that of the resin 47. For example, the coefficient of linear expansion of the resin 47 is 25μ/° C. or more while the coefficient of linear expansion of the glass frit particles 49 is 3μ/° C. or more and 8μ/° C. or less.

The form, particle size, and filling rate of the glass frit particles 49 may be set as appropriate. In the illustrated example, the form of the glass frit particles 49 is a needle-like form (a form obtained by, for example, pulverizing glass). However, the form of the glass frit particles 49 may be any other form, such as a spherical form. The particle size (the diameter of a corresponding circle) of the glass frit particles 49 is, for example, 1 μm or more and 100 μm or less. The volume filling rate of the glass frit particles 49 is, for example, 5% or more and 95% or less.

When the joining member 9 contains the plurality of glass frit particles 49, the coefficient of linear expansion thereof is closer to the coefficient of linear expansion of the electronic element 13 and that of the terminal substrate 7 than when the joining member 9 is made of, for example, only the resin 47. The coefficients of linear expansion of the respective members in such a case are, for example, as follows. The coefficient of linear expansion of the electronic element 13 (element substrate 23) is $3\mu/°$ C. or more and $17\mu/°$ C. or less. The coefficient of linear expansion of the terminal substrate 7 is $5\mu/°$ C. or more and $20\mu/°$ C. or less. The coefficient of linear expansion of the resin 47 and that of the glass frit particles 49 are as described above.

In the example illustrated in FIG. 5B, the joining member 9 is constituted by a plurality of (three in the illustrated example) layers. More specifically, the joining member 9 includes an upper layer 51, a middle layer 53, and a lower layer 55 in this order from the main-body substrate 5 to the terminal substrate 7.

The middle layer 53 is, for example, thicker than the upper layer 51 and the lower layer 55 and contributes to attaining of a thickness of the joining member 9 that corresponds to the thickness of the bumps 11. The upper layer 51 and the lower layer 55 are made of, for example, a material that is more adhesive than the middle layer 53.

The middle layer 53 is made of, for example, a material that contains the resin 47 and the plurality of glass frit particles 49 similarly to the joining member 9 illustrated in FIG. 5A. However, the middle layer 53 need not have an adhesion function, and therefore, the resin 47 may be a resin different from the resin 47 in FIG. 5A. Unlike the illustrated example, the middle layer 53 may be made of an amorphous inorganic material or a crystal inorganic material or may be made of a plurality of stacked layers. The ratio of the thickness of the middle layer 53 to the thickness of the joining member 9 may be set as appropriate and may be set to, for example, one-half or more, two-thirds or more, or four-fifths or more.

The upper layer 51 and the lower layer 55 are made of, for example, only a resin. As the resin, for example, the resins listed in the description of the resin 47 may be used.

In the example illustrated in FIG. 5C, the joining member 9 includes a base material 57 and the resin 47 that covers the base material 57 (from a different point of view, with which the base material 57 is impregnated) as in printed wiring boards made of a resin.

The base material 57 is, for example, a glass fabric (the illustrated example), a glass nonwoven fabric, a synthetic fabric, or paper, and materials publicly known as substrates of printed wiring boards may be used. FIG. 5C schematically illustrates the longitudinal sections of the warps of the glass fabric and the transverse sections of the wefts thereof. Regarding glass that makes up the glass fabric, the description of the glass that makes up the glass frit particles 49 may be quoted. The diameter and the like of the warps and the wefts of the glass fabric may be set as appropriate. For example, the diameter of the threads of the glass fabric (the diameter of a corresponding circle) is 1 μm or more and 20 μm or less. Regarding the resin 47, the description of FIG. 5A may be quoted.

When the joining member 9 includes the base material 57, for example, the coefficient of linear expansion thereof is made lower than when the joining member 9 is made of only the resin 47, and the coefficient of linear expansion is closer to the coefficient of linear expansion of the electronic element 13 and that of the terminal substrate 7 accordingly. Further, the base material 57 contributes to an increase in the strength of the electronic component 1. Note that the joining member 9 in FIG. 5C may be used as the middle layer 53 in FIG. 5B.

Method for Manufacturing Electronic Component

Figure 6:
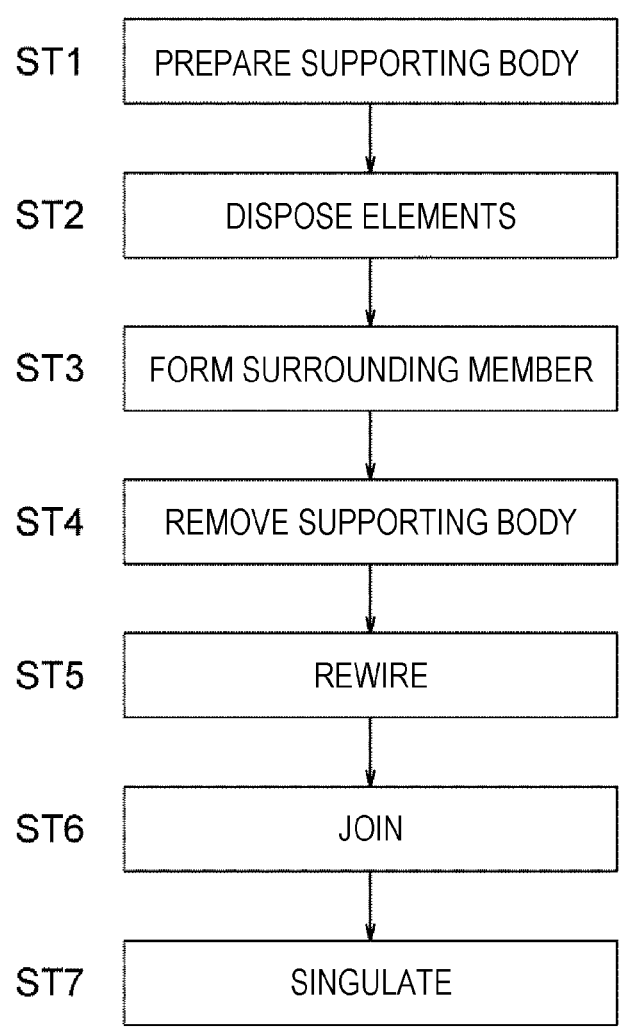
FIG. 6 is a flowchart illustrating an example procedure of a method for manufacturing the electronic component illustrated in FIG. 1A.

FIG. 6 is a flowchart illustrating an example procedure of a method for manufacturing the electronic component 1. FIG. 7A to FIG. 8C are schematic cross-sectional views for complementing FIG. 6 and correspond to FIG. 2. Note that in FIG. 7A to FIG. 8C, unlike in FIG. 2, the details may be omitted. As the manufacturing method proceeds, the state and form of a material that constitutes the electronic component 1 change; however, the same reference numeral may be used before and after the change.

Figure 7A:
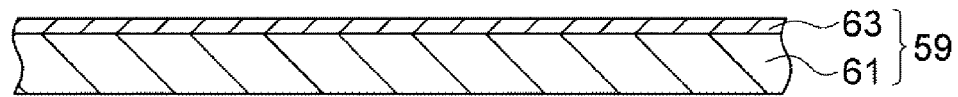
FIG. 7A, FIG. 7B, FIG. 7C, and FIG. 7D are schematic cross-sectional views for complementing FIG. 6.

In step ST1, as illustrated in FIG. 7A, a supporting body 59 is prepared. The supporting body 59 is, for example, a member having a flat top surface. The top surface has an extent in which a plurality of electronic components 1 can be arranged. Note that FIG. 7A illustrates a range that corresponds to one electronic component 1. The supporting body 59 is made of, for example, a resin sheet 61 that is coated with an adhesive agent 63, and is supported by a support not illustrated. Note that the supporting body 59 may be formed by coating the flat top surface of the support not illustrated with a bonding material or an adhesive material.

Figure 7B:
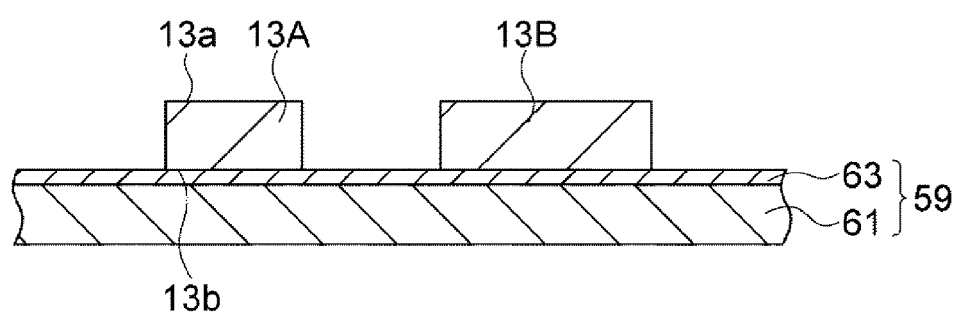

In step ST2, as illustrated in FIG. 7B, the electronic elements 13A and 13B are disposed on the top surface of the supporting body 59. More specifically, each electronic element 13 is disposed such that the bottom surface 13b faces the top surface of the supporting body 59. The positional relationship between the electronic elements 13A and 13B at this time is the same as the positional relationship in the electronic component 1. Here, although only the electronic elements 13A and 13B that correspond to one electronic component 1 are illustrated, the electronic elements 13A and 13B corresponding to each of the plurality of electronic components 1 are disposed on the top surface of the supporting body 59.

Figure 7C:
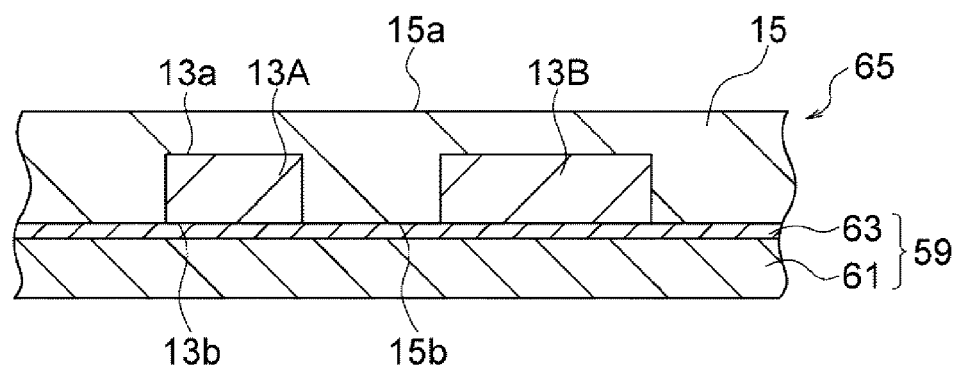

In step ST3, as illustrated in FIG. 7C, a material that makes up the surrounding member 15 is supplied onto the supporting body 59 and hardened. Accordingly, the electronic elements 13A and 13B are buried in the surrounding member 15. Note that the bottom surface 13b of each electronic element 13 is in close contact with the supporting body 59, and therefore, is not covered by the surrounding member 15 but is exposed from the bottom surface 15b of the surrounding member 15. From a different point of view, when the material that makes up the surrounding member 15 is hardened, a wafer 65 from which a large number of combinations of the electronic elements 13A and 13B and the surrounding member 15 can be taken is formed.

The material that makes up the surrounding member 15 may be, for example, a liquid material or a powder material. The material that makes up the surrounding member 15 may be supplied with any appropriate method. For example, a liquid material may be supplied by using a dispenser or by screen printing, or a sheet-like molded material that becomes a liquid when heated may be disposed.

The material that makes up the surrounding member 15 is hardened by, for example, heating the material while applying pressure thereto. The specific method may be any appropriate method. For example, the material may be heated by a heater of the support not illustrated that supports the supporting body 59 and/or the material may be pressed from above by a mold that includes a heater.

Figure 7D:
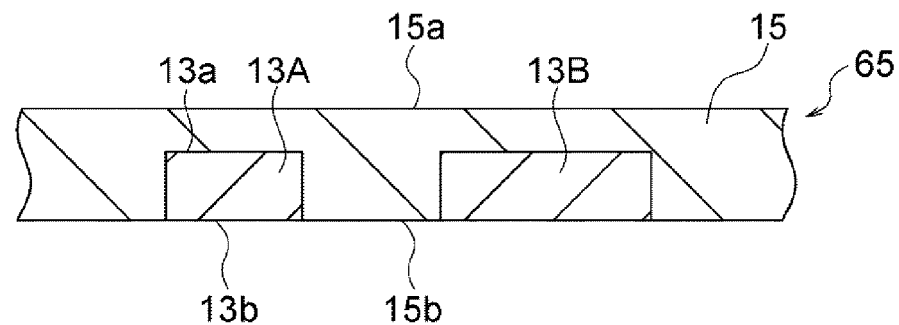

In step ST4, as illustrated in FIG. 7D, the supporting body 59 is removed from the wafer 65. The supporting body 59 may be removed by peeling or may be removed by melting the supporting body 59 or dissolving the supporting body 59 with a chemical solution. The surface from which the supporting body 59 has been removed may be washed as appropriate.

Figure 8A:
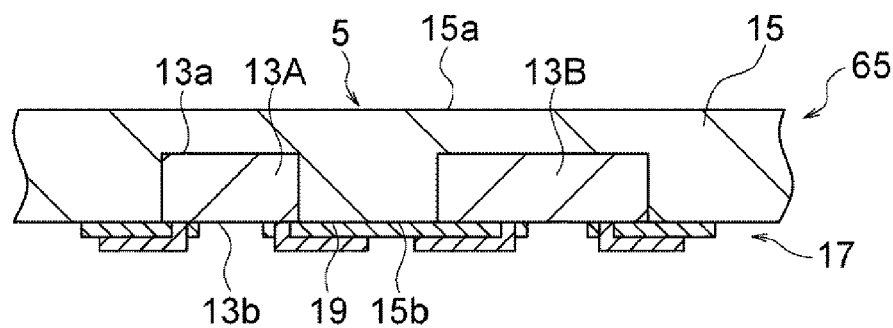
FIG. 8A, FIG. 8B, and FIG. 8C, are cross-sectional views following FIG. 7D.

In step ST5, as illustrated in FIG. 8A, the rewiring layer 17 is provided on the surface (joint surface 19) of the wafer 65 from which the supporting body 59 has been removed. To form the rewiring layer 17, for example, a publicly known method, such as the additive method or the semi-additive method, may be used. When the rewiring layer 17 is formed, the main-body substrate 5 is obtained.

Figure 8B:
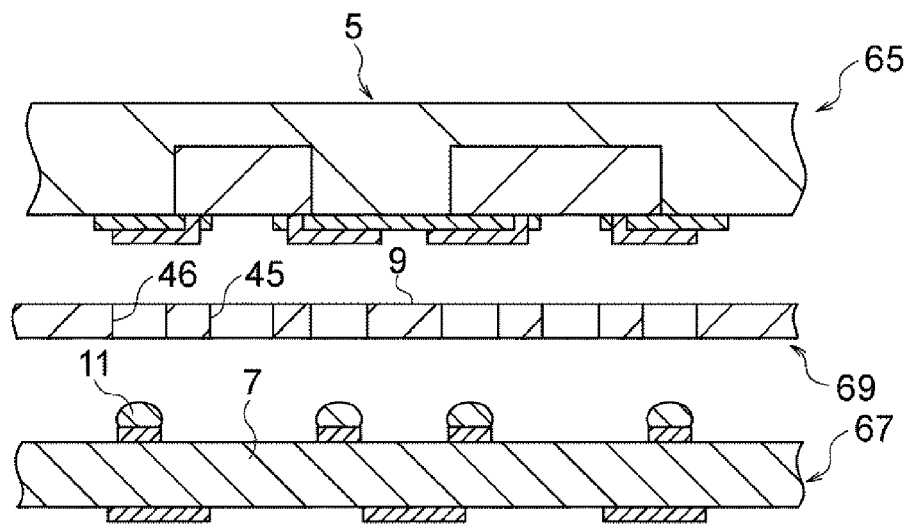

In step ST6, as illustrated in FIG. 8B, the main-body substrate 5 and the terminal substrate 7 are joined together by the joining member 9 and the bumps 11. From a different point of view, the wafer 65 from which a large number of main-body substrates 5 are taken and a wafer 67 from which a large number of terminal substrates 7 are taken are joined together by a wafer 69 from which a large number of joining members 9 are taken and by the bumps 11.

The bumps 11 are first disposed on one of the main-body substrate 5 (main-body terminals 35a) or the terminal substrate 7 (pads 43). Then, when the main-body substrate 5 and the terminal substrate 7 are stacked with the material that makes up the joining member 9 interposed therebetween, the bumps 11 are accommodated in the second through holes 46 and are brought into contact with the other of the main-body substrate 5 or the terminal substrate 7. Thereafter, the bumps 11 are melted by heating, solidified after the end of heating, and joined to the main-body terminals 35a and the pads 43 respectively.

Heating for joining the joining member 9 and heating for joining the bumps 11 may be performed in the same step. For example, by heating using a reflow oven, joining of the joining member 9 and joining of the bumps 11 may be performed almost simultaneously. Further, joining may be performed in an appropriate atmosphere, such as a vacuum atmosphere or an atmosphere of an inert gas.

Figure 8C:
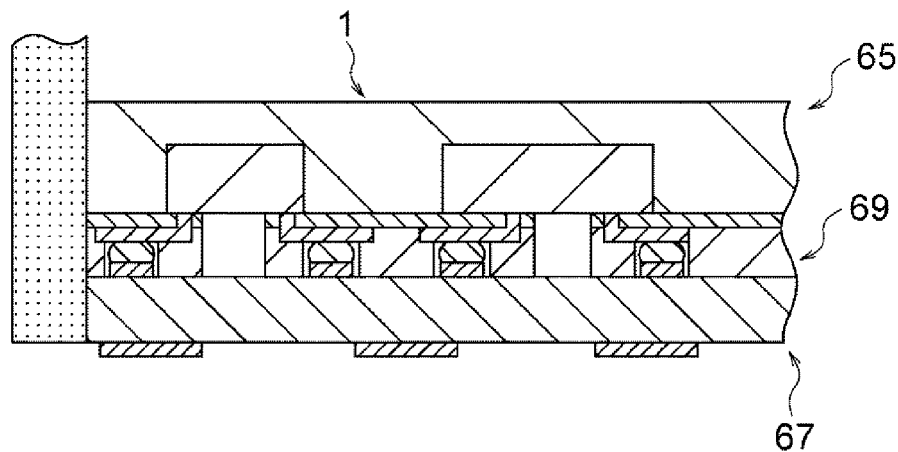

In step ST7, as illustrated in FIG. 8C, the stacked body constituted by the wafers 65, 67, and 69 is cut by dicing and singulated. Accordingly, the electronic components 1 are manufactured. Note that dicing may be performed with a publicly known method and may be performed by using, for example, a dicing blade or by laser.

Although a mode in which the electronic components 1 are manufactured on a per wafer basis has been described above, the above-described steps may be performed for the individual electronic component 1.

As described above, in this embodiment, the electronic component 1 includes the electronic element 13, the surrounding member 15, the wiring board (terminal substrate 7), the joining member 9, and the bump 11. The electronic element 13 has a first surface (bottom surface 13b). The insulating surrounding member 15 has a second surface (bottom surface 15b) and is in close contact with the electronic element 13 so as to surround the electronic element 13 while allowing the bottom surface 13b to be exposed from the bottom surface 15b. The terminal substrate 7 faces a third surface (joint surface 19) constituted by the bottom surface 13b and the bottom surface 15b. The insulating joining member 9 is interposed between the joint surface 19 and the terminal substrate 7 and joins the joint surface 19 and the terminal substrate 7 together. The conductive bump 11 is located between the joint surface 19 and the terminal substrate 7 and electrically connects the electronic element 13 and the terminal substrate 7 to each other. The joining member 9 has the first through hole 45 and the second through hole 46. The first through hole 45 passes through the joining member 9 from the joint surface 19 to the terminal substrate 7 and overlaps the vibration region 13c (at least in part) in perspective plan view. The second through hole 46 passes through the joining member 9 from the joint surface 19 to the terminal substrate 7 and accommodates the bump 11. In perspective plan view, at least a portion of at least one of the first through hole 45 or the second through hole 46 (in this embodiment, the second through hole 46) overlaps the bottom surface 15b (is located outside the electronic element 13).

Therefore, for example, flexibility in the design of the first through hole 45 and/or the second through hole 46 is increased. From a different point of view, the surrounding member 15 contributes to locating of a portion of the first through hole 45 and/or the second through hole 46, which is to be sealed, outside the electronic element 13 in addition to protection of the electronic element 13. When flexibility in the design of the first through hole 45 and/or the second through hole 46 is increased, flexibility in the design of the electronic element 13 and the like is increased accordingly.

In this embodiment, at least a portion of the second through hole 46 overlaps the bottom surface 15b of the surrounding member 15 in perspective plan view (is located outside the electronic element 13).

Therefore, for example, the second through hole 46 can be extended outside the electronic element 13 and/or the second through hole 46 can be shifted toward the outside of the electronic element 13 while the second through hole 46 is kept sealed. When the second through hole 46 is shifted toward the outside of the electronic element 13, for example, the first through hole 45 (vibration region 13c) can be made larger relative to the extent of the bottom surface 13b of the electronic element 13. From a different point of view, the electronic element 13 can be reduced in size relative to the vibration region 13c. Accordingly, the number of electronic elements 13 that can be taken from a wafer from which a large number of element substrates 23 are taken is increased, which increases productivity.

In this embodiment, at least a portion of the bump 11 overlaps the bottom surface 15b of the surrounding member 15 in perspective plan view (is located outside the electronic element 13).

As described above, at least a portion of the second through hole 46 overlaps the bottom surface 15b, and therefore, at least a portion of the bump 11 accommodated in the second through hole 46 can overlap the bottom surface 15b. From a different point of view, the surrounding member 15 contributes to locating of a portion of the rewiring layer 17 joined to the bump 11 outside the electronic element 13 in addition to protection of the electronic element 13 and an increase in flexibility in the design of the second through hole 46. Accordingly, flexibility in the design of the electronic element 13 is further increased. For example, the need to make the element terminals 21 of the electronic element 13 have a shape, dimensions, and a material suitable to joining to the bumps 11 is reduced. The element terminals 21 need not support the electronic element 13, and therefore, the need to provide the element terminals 21 in the four corners is reduced. This facilitates, for example, enlargement of the vibration region 13c relative to the extent of the bottom surface 13b of the electronic element 13. In other words, the electronic element 13 can be reduced in size relative to the vibration region 13c. Accordingly, the number of electronic elements 13 that can be taken from a wafer from which a large number of element substrates 23 are taken is increased, which increases productivity.

In this embodiment, a gap is present between the second through hole 46 and the bump 11.

In this case, for example, the probability that the bump 11 runs over the second through hole 46 is reduced, and the probability of a short circuit is reduced accordingly. Regarding the manufacturing method, the probability that the bump 11 runs over the second through hole 46 is reduced, and therefore, the bump 11 is allowed to be melted before completion of joining of the joining member 9 to the main-body substrate 5 and to the terminal substrate 7 by hardening of the joining member 9. This facilitates, as described in this embodiment, implementation of the manufacturing method in which joining of the bump 11 and joining of the joining member 9 are performed substantially simultaneously.

In this embodiment, the surrounding member 15 covers the side surfaces of the electronic element 13 so as to entirely surround the electronic element 13 and also covers a surface (top surface 13a) opposite to the bottom surface 13b of the electronic element 13.

Therefore, for example, protection of the electronic element 13 by the surrounding member 15 is strengthened. Further, for example, the strength of fixing of the surrounding member 15 and the electronic element 13 to each other is also increased. For example, when the second through hole 46 (or the first through hole 45) extends across the bottom surface 13b of the electronic element 13 and the bottom surface 15b of the surrounding member 15, once peeling occurs between a side surface of the electronic element 13 and a side surface of the surrounding member 15, a gap produced as a result of the peeling and the second through hole 46 open into each other. When the surrounding member 15 covers the side surfaces of the electronic element 13 so as to entirely surround the electronic element 13 and the top surface 13a thereof, the probability that the gap opening into the second through hole 46 opens into the outside of the electronic component 1 is reduced. Accordingly, reliability concerning sealing of the second through hole 46 is increased.

In this embodiment, the joining member 9 includes the resin 47 and the plurality of glass frit particles 49 mixed in the resin 47.

Therefore, for example, with the glass frit particles 49, the coefficient of linear expansion of the joining member 9 can be adjusted, and the difference in thermal expansion between the joining member 9 and the main-body substrate 5 and/or the difference in thermal expansion between the joining member 9 and the terminal substrate 7 can be reduced. Accordingly, for example, the probability that peeling and/or thermal stress occurs due to the difference in thermal expansion can be reduced. When the electronic element 13 is an SAW element, thermal stress that occurs in the element substrate 23 affects the propagation characteristics of an SAW. Therefore, reduction in the thermal stress increases reliability of the electronic component 1 in terms of its electric characteristics.

In this embodiment, the terminal substrate 7 includes the external terminals 3 that are electrically connected to the electronic element 13, on a surface of the terminal substrate 7 opposite to the third surface (joint surface 19) in a region that overlaps the joint surface 19 in perspective plan view.

When the terminal substrate 7 has the above-described configuration, the terminal substrate 7 can be considered to constitute the electronic component 1 of a chip type together with the electronic element 13. As already described, when at least a portion of the first through hole 45 and/or the second through hole 46 is located outside the electronic element 13, the vibration region 13c can be relatively enlarged, and therefore, the vibration region 13c can be enlarged also in the electronic component 1 of a chip type. From a different point of view, in this embodiment, the electronic component 1 of a chip type can be reduced in size relative to the vibration region 13c.

In this embodiment, the method for manufacturing the electronic component 1 includes a disposition step (ST2), a forming step (ST3), a removal step (ST4), and a joining step (ST6). In the disposition step, the electronic element 13 is disposed on the supporting body 59 so as to bring the first surface (bottom surface 13b) into close contact with the supporting body 59. In the forming step, an insulating material is supplied around the electronic element 13 on the supporting body 59 and hardened to form the surrounding member 15. In the removal step, the supporting body 59 is removed from the bottom surface 13b of the electronic element 13 and from the second surface (bottom surface 15b) of the surrounding member 15 from which the bottom surface 13b is exposed. In the joining step, an insulating material that makes up the joining member 9 is disposed between the third surface (joint surface 19) constituted by the bottom surface 13b and the bottom surface 15b and the terminal substrate 7 to join the joint surface 19 and the terminal substrate 7 together, and the conductive bump 11 is disposed between the joint surface 19 and the terminal substrate 7 to electrically connect the electronic element 13 and the terminal substrate 7 to each other. In the joining step, in the material that makes up the joining member 9, the first through hole 45 and the second through hole 46 are made. The first through hole 45 passes through the material making up the joining member 9 from the joint surface 19 to the terminal substrate 7 and overlaps the vibration region 13c in perspective plan view. The second through hole 46 passes through the material making up the joining member 9 from the joint surface 19 to the terminal substrate 7 and accommodates the bump 11. In the joining step, in perspective plan view, at least a portion of the second through hole 46 overlaps the bottom surface 15b of the surrounding member 15 (is located outside the electronic element 13).

The above-described manufacturing method facilitates, for example, implementation of the electronic component 1 according to this embodiment. For example, the surrounding member 15 having a form that corresponds to the form of the electronic element 13 can be formed more easily and close contact between the electronic element 13 and the surrounding member 15 can be increased more easily than in a mode in which the surrounding member 15 that is formed (hardened) in advance and the electronic element 13 are joined together with a bonding agent (such a mode may also be included in the technique according to the present disclosure). Further, the plurality of electronic elements 13 are joined by the material that makes up the surrounding member 15 to form the wafer 65, which allows manufacturing of the plurality of electronic components 1 (forming of the rewiring layer 17, joining of the main-body substrate 5 and the terminal substrate 7 together, and the like) in bulk.

In this embodiment, the material that makes up the joining member 9 is a non-hardened sheet.

In this case, for example, unlike a mode in which a liquid material that makes up the joining member 9 is disposed by screen printing (this mode may also be included in the technique according to the present disclosure), the base material 57 (glass fabric or the like) as illustrated in FIG. 5C can be disposed in the joining member 9. Further, for example, the diameter of the filler (the glass frit particles 49 or the like) can be increased. This facilitates, for example, reduction in the coefficient of linear expansion of the joining member 9 and/or an increase in the strength of the joining member 9.

Second Embodiment

Figure 9:
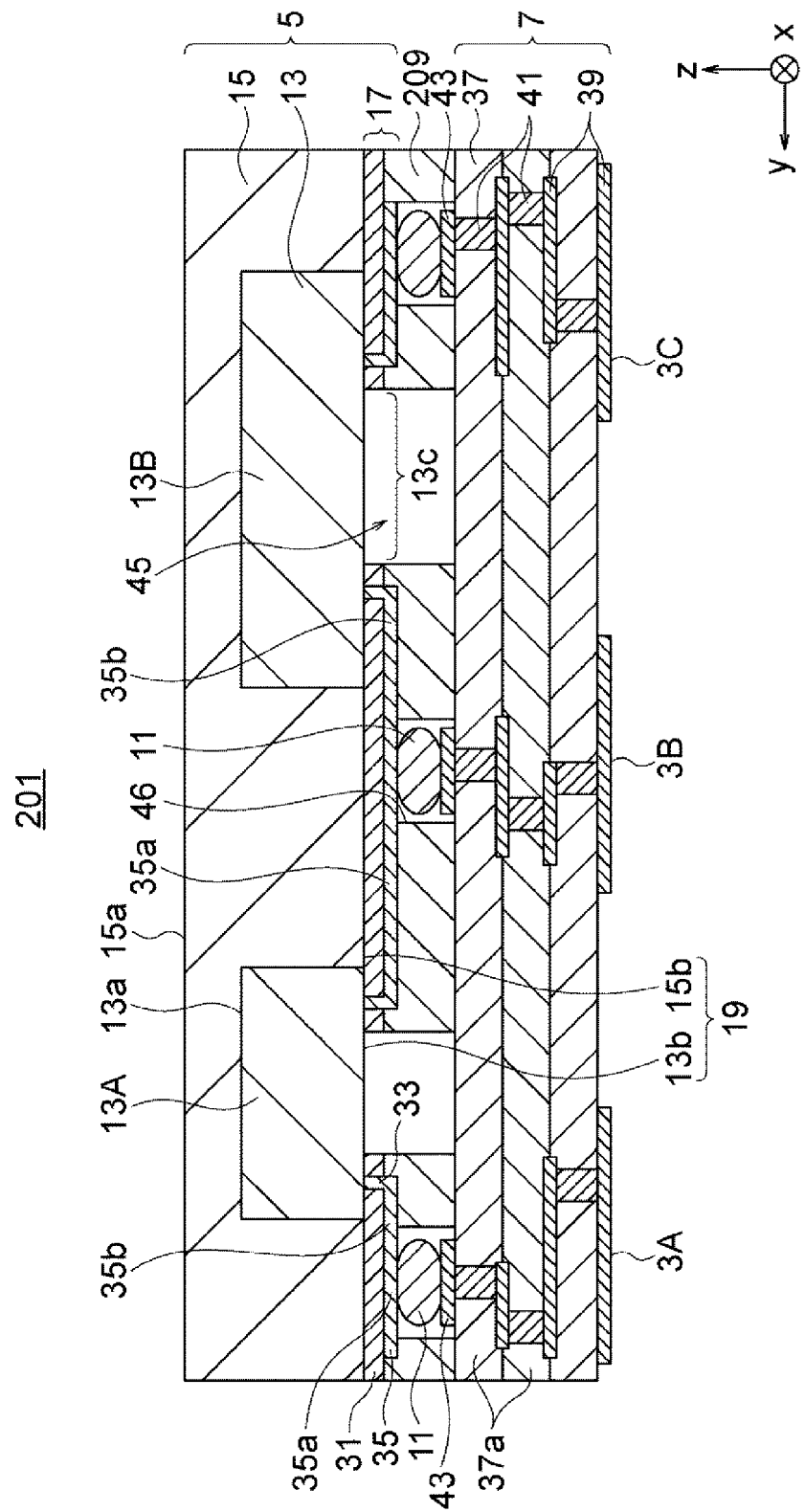
FIG. 9 is a schematic cross-sectional view illustrating a configuration of an electronic component according to a second embodiment.

FIG. 9 is a schematic cross-sectional view illustrating a configuration of an electronic component 201 according to a second embodiment and corresponds to FIG. 2 of the first embodiment.

In the first embodiment, both the electronic elements 13A and 13B are electrically connected to the same external terminal 3 (3B in the example in FIG. 2). Also in this embodiment, both the electronic elements 13A and 13B are electrically connected to the external terminal 3B.

However, in the first embodiment, one of the element terminals 21 of the electronic element 13A and one of the element terminals 21 of the electronic element 13B, namely two element terminals 21 in total, that are electrically connected to the external terminal 3B are electrically connected to the terminal substrate 7 via the separate main-body terminals 35a respectively. In contrast, in this embodiment, both the two element terminals 21 (not illustrated in FIG. 9, see FIG. 3 and FIG. 4) of the electronic elements 13A and 13B electrically connected to the external terminal 3B are electrically connected to the external terminal 3B via the same main-body terminal 35a.

In other words, the electronic elements 13A and 13B are connected to each other by the conductor layer 35 (more specifically, a conductor pattern constituted by the wiring pattern 35b and the main-body terminal 35a) at least a portion of which is located on the bottom surface 15b of the surrounding member 15. From a different point of view, the electronic elements 13A and 13B share the main-body terminal 35a, the bump 11, and the pad 43.

Due to the above-described difference, in this embodiment, an electric path in the terminal substrate 7 from the pad 43 to the external terminal 3B is also different from electric paths in the first embodiment. Specifically, although separate paths (at least portions thereof are separate) from the two pads 43 to the external terminal 3B are formed in the first embodiment, one path from one pad 43 to the external terminal 3B is formed in this embodiment.

As described above, also in this embodiment, the electronic component 201 includes the electronic element 13, the surrounding member 15, the terminal substrate 7, a joining member 209, and the bump 11. In perspective plan view, at least a portion of at least one of the first through hole 45 or the second through hole 46 overlaps the bottom surface 15b (is located outside the electronic element 13). Therefore, effects similar to those in the first embodiment are produced. For example, flexibility in the design of the first through hole 45 and/or the second through hole 46 can be increased.

In this embodiment, the electronic component 1 includes the two or more electronic elements 13A and 13B with which the same surrounding member 15 is in close contact, and the conductor pattern (the main-body terminal 35a and the wiring pattern 35b) at least a portion of which is located on the second surface (bottom surface 15b) of the surrounding member 15 and that connects the two or more electronic elements 13A and 13B to each other.

Therefore, for example, the surrounding member 15 contributes to disposition of the conductor pattern for connecting the electronic elements 13 to each other in addition to protection of the electronic component 1 and an increase in flexibility in the design of the first through hole 45 and/or the second through hole 46. Accordingly, for example, the configuration of the terminal substrate 7 can be simplified. Further, for example, an effect of the terminal substrate 7 on the electric connection between the electronic elements 13A and 13B can be reduced. As a result, for example, a change in the electric characteristics of the main-body substrate 5 before and after the main-body substrate 5 is mounted on the terminal substrate 7 can be reduced.

Note that in the above-described embodiments, the terminal substrate 7 is an example of the wiring board. The bottom surface 13b of the electronic element 13 is an example of the first surface. The bottom surface 15b of the surrounding member 15 is an example of the second surface. The joint surface 19 is an example of the third surface.

The technique according to the present disclosure is not limited to the above-described embodiments and may be implemented in various modes.

The above-described embodiments may be combined as appropriate. For example, a configuration in which the two electronic elements 13A and 13B of the second embodiment are electrically connected to each other by the rewiring layer 17 may be applied to the first embodiment. Specifically, for example, in a mode in which the joining member 9 of the first embodiment is provided, without sharing the main-body terminal 35a, the bump 11, and the pad 43, the two electronic elements 13A and 13B may be electrically connected to each other by providing the wiring pattern 35b that connects the main-body terminal 35a of the electronic element 13A and the main-body terminal 35a of the electronic element 13B to each other.

The electronic element is not limited to a piezoelectric element or an acoustic wave element. For example, the electronic element may be a semiconductor element (an IC or the like), a resistive element, an inductor, or a capacitor. The piezoelectric element is not limited to an SAW element. For example, the piezoelectric element may be a film bulk acoustic resonator (FBAR) or a boundary acoustic wave element (which is included in an SAW element in a broad sense).

The wiring board is not limited to the terminal substrate that constitutes the electronic component of a chip type. For example, the wiring board may be a board that functions as a mother board (main board) of an electronic device, such as a portable device.

Even when the second through hole is located outside the electronic element in perspective plan view, the bump accommodated in the second through hole and the main-body terminal and the pad joined to the bump need not be located outside the electronic element and may be fit in the electronic element in perspective plan view.

In the embodiments, the rewiring layer 17 is provided on the third surface (joint surface 19), and the main-body terminal 35a included in the rewiring layer 17 and the pad 43 of the terminal substrate 7 are joined together. However, the rewiring layer 17 as described above need not be provided, and the element terminal 21 may be used as the main-body terminal and the element terminal 21 and the pad 43 may be joined together by the bump 11.

In the embodiments, separate first through holes 45 are provided for the two electronic elements 13 respectively. However, the first through holes 45 of the two electronic elements 13 may be concatenated. The same applies to the second through holes 46. The first through hole 45 and the second through hole 46 may be concatenated while the first through hole 45 and the second through hole 46 are distinguishable from each other from their shapes and the like.

REFERENCE SIGNS LIST

1 electronic component, 7 terminal substrate (wiring board), joining member, 11 bump, 13 electronic element, 13*b* bottom surface (of electronic element) (first surface), 15 surrounding member, 15*b* bottom surface (of surrounding member) (second surface), 19 joint surface (third surface), 45 first through hole, 46 second through hole

The invention claimed is:

1. An electronic component comprising:
   an electronic element that has a first surface;
   a surrounding member that is an insulating member, has a second surface, and is in close contact with the electronic element so as to surround the electronic element while allowing the first surface to be exposed from the second surface;
   a wiring board that faces a third surface constituted by the first surface and the second surface;
   a joining member that is an insulating member, is interposed between the third surface and the wiring board, and joins the third surface and the wiring board together; and
   a bump that is a conductive bump, is located between the third surface and the wiring board, and electrically connects the electronic element and the wiring board to each other, wherein
   the first surface includes a vibration region that vibrates in response to an electric signal input to the electronic element,
   the joining member has
      a first through hole that passes through the joining member from the third surface to the wiring board and overlaps the vibration region in perspective plan view, and
      a second through hole that passes through the joining member from the third surface to the wiring board and accommodates the bump, and
      at least a portion of at least one of the first through hole or the second through hole overlaps the second surface in perspective plan view.

2. The electronic component according to claim 1, wherein
   at least a portion of the second through hole overlaps the second surface in perspective plan view.

3. The electronic component according to claim 2, wherein
   at least a portion of the bump overlaps the second surface in perspective plan view.

4. The electronic component according to claim 2, wherein
   a gap is present between the second through hole and the bump.

5. The electronic component according to claim 1, wherein
   the surrounding member covers a side surface of the electronic element so as to entirely surround the electronic element and also covers a surface of the electronic element opposite to the first surface.

6. The electronic component according to claim 1, comprising:
   two or more electronic elements each of which is the electronic element and with which the surrounding member is in close contact; and
   a conductor pattern at least a portion of which is located on the second surface and that connects the two or more electronic elements to each other.

7. The electronic component according to claim 1, wherein
   the joining member includes a resin and a plurality of glass frit particles mixed in the resin.

8. The electronic component according to claim 1, wherein
   the wiring board includes an external terminal that is electrically connected to the electronic element, on a surface of the wiring board opposite to the third surface in a region that overlaps the third surface in perspective plan view.

9. An electronic component manufacturing method comprising:
   a disposition step of disposing an electronic element on a supporting body so as to bring a first surface of the electronic element into close contact with the supporting body;
   a forming step of supplying an insulating material around the electronic element on the supporting body and hardening the insulating material to form a surrounding member;
   a removal step of removing the supporting body from the first surface and from a second surface of the surrounding member from which the first surface is exposed; and
   a joining step of disposing an insulating material that makes up a joining member between a third surface constituted by the first surface and the second surface and a wiring board to join the third surface and the wiring board together, and disposing a conductive bump between the third surface and the wiring board to electrically connect the electronic element and the wiring board to each other, wherein
   in the joining step,
      in the material that makes up the joining member,
         a first through hole that passes through the material making up the joining member from the third surface to the wiring board and overlaps the vibration region in perspective plan view, and
         a second through hole that passes through the material making up the joining member from the third surface to the wiring board and accommodates the bump are made, and
      at least a portion of at least one of the first through hole or the second through hole overlaps the second surface in perspective plan view.

10. The electronic component manufacturing method according to claim 9, wherein
   the material that makes up the joining member is a non-hardened sheet.

* * * * *